US009545140B1

(12) United States Patent
Johnson et al.

(10) Patent No.: US 9,545,140 B1
(45) Date of Patent: Jan. 17, 2017

(54) PROTECTIVE ENCLOSURE FOR AN ELECTRONIC DEVICE

(71) Applicant: OTTER PRODUCTS, LLC, Fort Collins, CO (US)

(72) Inventors: Jamie L. Johnson, Fort Collins, CO (US); Jonathan H. Guerdrum, Fort Collins, CO (US); Aaron M. Gaylord, Fort Collins, CO (US); Shanshan Li, Fort Collins, CO (US)

(73) Assignee: Otter Products, LLC, Fort Collins, CO (US)

( * ) Notice: Subject to any disclaimer, the term of this patent is extended or adjusted under 35 U.S.C. 154(b) by 0 days.

(21) Appl. No.: 14/976,375

(22) Filed: Dec. 21, 2015

Related U.S. Application Data

(60) Provisional application No. 62/202,681, filed on Aug. 7, 2015, provisional application No. 62/194,242, filed on Jul. 19, 2015.

(51) Int. Cl.
| | |
|---|---|
| *H04M 1/00* | (2006.01) |
| *A45C 11/00* | (2006.01) |
| *A45F 5/00* | (2006.01) |
| *H05K 5/03* | (2006.01) |
| *H05K 5/02* | (2006.01) |
| *H04B 1/3888* | (2015.01) |

(52) U.S. Cl.
CPC .............. *A45C 11/00* (2013.01); *A45F 5/00* (2013.01); *H04B 1/3888* (2013.01); *H05K 5/0217* (2013.01); *H05K 5/03* (2013.01); *A45C 2011/002* (2013.01); *A45C 2011/003* (2013.01)

(58) Field of Classification Search
CPC ..... A45C 11/00; A45C 11/002; A45C 11/003; A45F 5/00; H05K 5/03; H05K 5/0217; H04B 1/3888
USPC ................ 455/575.8, 575.1, 550.1
See application file for complete search history.

(56) References Cited

U.S. PATENT DOCUMENTS

| | | |
|---|---|---|
| 2,392,787 A | 1/1946 | Edmond |
| 3,023,885 A | 3/1962 | Kindseth |
| 3,590,988 A | 7/1971 | Hollar |
| 4,326,102 A | 4/1982 | Culp et al. |
| 4,352,968 A | 10/1982 | Pounds |
| 4,703,161 A | 10/1987 | McLean |

(Continued)

FOREIGN PATENT DOCUMENTS

| | | |
|---|---|---|
| JP | H0818637 A | 6/1994 |
| WO | 2013027126 A2 | 2/2013 |

*Primary Examiner* — Khai M Nguyen

(57) ABSTRACT

A protective enclosure for an electronic device includes a back structural member configured to connect with a front structural member, the back and front structural member forming a hard shell shaped to and surrounding an installed electronic device. An external cushion member can be disposed over the hard shell of the protective enclosure. An internal cushion member can be lined in between the back structural member and the electronic device. The internal cushion member can have an opening aligned with a feature on the electronic device, a portion along the opening of the internal cushion member formed to protrude through an aligned opening in the hard shell which also corresponds to an opening in the external cushion member, the portion of the internal cushion member contacting an outer surface of the external cushion member and sealing the surface of the protective enclosure from dust and debris.

20 Claims, 11 Drawing Sheets

(56) References Cited

U.S. PATENT DOCUMENTS

| | | |
|---|---|---|
| 4,733,776 A | 3/1988 | Ward |
| 4,736,418 A | 4/1988 | Steadman |
| 4,762,227 A | 8/1988 | Patterson |
| 4,836,256 A | 6/1989 | Meliconi |
| 4,901,852 A | 2/1990 | King |
| 5,025,921 A | 6/1991 | Gasparaitis et al. |
| 5,092,458 A | 3/1992 | Yokoyama |
| 5,092,459 A | 3/1992 | Uljanic et al. |
| 5,123,044 A | 6/1992 | Tate |
| 5,175,873 A | 12/1992 | Goldenberg et al. |
| 5,230,016 A | 7/1993 | Yasuda |
| 5,360,108 A | 11/1994 | Alagia |
| 5,368,159 A | 11/1994 | Doria |
| 5,386,084 A | 1/1995 | Risko |
| 5,388,692 A | 2/1995 | Withrow et al. |
| 5,499,713 A | 3/1996 | Huffer |
| 5,625,688 A | 4/1997 | Ford et al. |
| 5,648,757 A | 7/1997 | Vernace et al. |
| 5,681,122 A | 10/1997 | Burke |
| 5,828,012 A | 10/1998 | Repolle et al. |
| 5,850,915 A | 12/1998 | Tajima |
| 5,923,752 A | 7/1999 | McBride et al. |
| 6,031,524 A | 2/2000 | Kunert |
| 6,041,924 A | 3/2000 | Tajima |
| 6,049,813 A | 4/2000 | Danielson et al. |
| 6,068,119 A | 5/2000 | Derr et al. |
| 6,082,535 A | 7/2000 | Mitchell |
| 6,094,785 A | 8/2000 | Montgomery et al. |
| 6,201,867 B1 | 3/2001 | Koike |
| 6,215,474 B1 | 4/2001 | Shah |
| 6,239,968 B1 | 5/2001 | Kim et al. |
| 6,273,252 B1 | 8/2001 | Mitchell |
| 6,301,100 B1 | 10/2001 | Iwata |
| D451,094 S | 11/2001 | Powell |
| 6,313,892 B2 | 11/2001 | Gleckman |
| 6,313,982 B1 | 11/2001 | Hino |
| 6,317,313 B1 | 11/2001 | Mosgrove et al. |
| 6,388,877 B1 | 5/2002 | Canova et al. |
| 6,415,138 B2 | 7/2002 | Sirola et al. |
| 6,445,577 B1 | 9/2002 | Madsen et al. |
| 6,456,487 B1 | 9/2002 | Hetterick |
| 6,471,056 B1 | 10/2002 | Tzeng |
| 6,512,834 B1 | 1/2003 | Banter et al. |
| 6,519,141 B2 | 2/2003 | Tseng et al. |
| 6,536,589 B2 | 3/2003 | Chang |
| 6,617,973 B1 | 9/2003 | Osterman |
| 6,646,864 B2 | 11/2003 | Richardson |
| 6,659,274 B2 | 12/2003 | Enners |
| 6,665,174 B1 | 12/2003 | Derr et al. |
| 6,701,159 B1 | 3/2004 | Powell |
| 6,731,913 B2 | 5/2004 | Humphreys et al. |
| 6,839,430 B2 | 1/2005 | Kwak |
| 6,926,141 B2 | 8/2005 | Montler |
| 6,932,187 B2 | 8/2005 | Banter et al. |
| 6,950,516 B2 | 9/2005 | Laaksonen et al. |
| 6,954,405 B2 | 10/2005 | Polany et al. |
| 6,962,454 B1 | 11/2005 | Costello |
| 6,980,777 B2 | 12/2005 | Shepherd et al. |
| 6,995,976 B2 | 2/2006 | Richardson |
| D516,554 S | 3/2006 | Richardson et al. |
| 7,054,441 B2 | 5/2006 | Pletikosa |
| 7,061,762 B2 | 6/2006 | Canova et al. |
| 7,069,063 B2 | 6/2006 | Halkosaari et al. |
| D526,780 S | 8/2006 | Richardson et al. |
| D530,079 S | 10/2006 | Thomas et al. |
| 7,146,701 B2 | 12/2006 | Mahoney et al. |
| 7,158,376 B2 | 1/2007 | Richardson et al. |
| 7,180,735 B2 | 2/2007 | Thomas et al. |
| 7,194,291 B2 | 3/2007 | Peng |
| D542,524 S | 5/2007 | Richardson et al. |
| 7,230,823 B2 | 6/2007 | Richardson et al. |
| 7,236,588 B2 | 6/2007 | Gartrell |
| 7,255,228 B2 | 8/2007 | Kim |
| 7,290,654 B2 | 11/2007 | Hodges |
| 7,312,984 B2 | 12/2007 | Richardson et al. |
| 7,341,144 B2 | 3/2008 | Tajiri et al. |
| 7,343,184 B2 | 3/2008 | Rostami |
| 7,400,917 B2 | 7/2008 | Wood et al. |
| D574,819 S | 8/2008 | Andre et al. |
| D575,056 S | 8/2008 | Tan |
| 7,409,148 B2 | 8/2008 | Takahashi et al. |
| 7,418,278 B2 | 8/2008 | Eriksson et al. |
| 7,428,427 B2 | 9/2008 | Brunstrom et al. |
| 7,436,653 B2 | 10/2008 | Yang et al. |
| D581,155 S | 11/2008 | Richardson et al. |
| D581,421 S | 11/2008 | Richardson et al. |
| 7,449,650 B2 | 11/2008 | Richardson et al. |
| D582,149 S | 12/2008 | Tan |
| D587,008 S | 2/2009 | Richardson et al. |
| 7,495,895 B2 | 2/2009 | Carnevali |
| D589,016 S | 3/2009 | Richardson et al. |
| D593,319 S | 6/2009 | Richardson et al. |
| D593,746 S | 6/2009 | Richardson et al. |
| 7,555,325 B2 | 6/2009 | Goros |
| D597,089 S | 7/2009 | Khan et al. |
| 7,558,594 B2 | 7/2009 | Wilson |
| D597,301 S | 8/2009 | Richardson et al. |
| 7,594,576 B2 | 9/2009 | Chen et al. |
| 7,609,512 B2 | 10/2009 | Richardson et al. |
| D603,602 S | 11/2009 | Richardson et al. |
| D603,603 S | 11/2009 | Laine et al. |
| 7,623,898 B2 | 11/2009 | Holmberg |
| D605,850 S | 12/2009 | Richardson et al. |
| D606,751 S | 12/2009 | Andre et al. |
| 7,663,878 B2 | 2/2010 | Swan et al. |
| 7,663,879 B2 | 2/2010 | Richardson et al. |
| 7,688,580 B2 | 3/2010 | Richardson et al. |
| D613,282 S | 4/2010 | Richardson et al. |
| 7,854,434 B2 | 12/2010 | Heiman et al. |
| 7,933,122 B2* | 4/2011 | Richardson ............ H04M 1/18 206/320 |
| 8,112,130 B2 | 2/2012 | Mittleman et al. |
| 8,342,325 B2 | 1/2013 | Rayner |
| 8,531,834 B2 | 9/2013 | Rayner |
| 2001/0048586 A1 | 12/2001 | Itou et al. |
| 2002/0009195 A1 | 1/2002 | Schon |
| 2002/0065054 A1 | 5/2002 | Humphreys et al. |
| 2002/0071550 A1 | 6/2002 | Pletikosa |
| 2002/0079244 A1 | 6/2002 | Kwong |
| 2002/0086702 A1 | 7/2002 | Lai et al. |
| 2002/0101707 A1 | 8/2002 | Canova et al. |
| 2002/0137475 A1 | 9/2002 | Shou et al. |
| 2002/0193136 A1 | 12/2002 | Halkosaari et al. |
| 2003/0151890 A1 | 8/2003 | Huang et al. |
| 2004/0014506 A1 | 1/2004 | Kemppinen |
| 2005/0279661 A1 | 12/2005 | Hodges |
| 2006/0124482 A1 | 6/2006 | Hodges |
| 2006/0226039 A1 | 10/2006 | Goradesky |
| 2006/0255493 A1 | 11/2006 | Fouladpour |
| 2006/0279924 A1 | 12/2006 | Richardson et al. |
| 2007/0071423 A1 | 3/2007 | Fantone et al. |
| 2007/0115387 A1 | 5/2007 | Ho |
| 2007/0158220 A1 | 7/2007 | Cleereman et al. |
| 2007/0297149 A1 | 12/2007 | Richardson et al. |
| 2008/0041896 A1 | 2/2008 | Holmberg |
| 2008/0083631 A1 | 4/2008 | Tsang et al. |
| 2008/0096620 A1 | 4/2008 | Lee et al. |
| 2008/0316687 A1* | 12/2008 | Richardson .......... H04B 1/3888 361/679.09 |
| 2009/0009945 A1 | 1/2009 | Johnson et al. |
| 2009/0247244 A1 | 10/2009 | Mittleman et al. |
| 2009/0283184 A1 | 11/2009 | Han |
| 2010/0093401 A1 | 4/2010 | Moran et al. |
| 2010/0093412 A1 | 4/2010 | Serra et al. |
| 2010/0096284 A1 | 4/2010 | Bau |
| 2010/0104814 A1* | 4/2010 | Richardson .......... H04B 1/3888 428/156 |
| 2010/0122756 A1 | 5/2010 | Longinotti-Buitoni |
| 2010/0203931 A1 | 8/2010 | Hynecek et al. |
| 2011/0157800 A1 | 6/2011 | Richardson et al. |
| 2012/0261289 A1* | 10/2012 | Wyner ................... A45C 11/00 206/320 |
| 2013/0063004 A1 | 3/2013 | Lai et al. |
| 2013/0156218 A1 | 6/2013 | Annacone et al. |

(56) References Cited

U.S. PATENT DOCUMENTS

| | | | |
|---|---|---|---|
| 2013/0292288 A1* | 11/2013 | Willes | H04M 1/185 |
| | | | 206/521 |
| 2013/0334071 A1 | 12/2013 | Carnevali | |
| 2014/0226062 A1* | 8/2014 | Parrill | H04N 5/2252 |
| | | | 348/376 |
| 2014/0262847 A1* | 9/2014 | Yang | A45C 11/00 |
| | | | 206/37 |
| 2014/0294217 A1 | 10/2014 | Yamaguchi et al. | |
| 2015/0270734 A1* | 9/2015 | Davison | H02J 7/0054 |
| | | | 320/103 |

* cited by examiner

PROTECTIVE ENCLOSURE FOR AN ELECTRONIC DEVICE

CROSS REFERENCE TO RELATED APPLICATIONS

This application claims the benefit of U.S. Provisional Application 62/194,242, filed Jul. 19, 2015, and U.S. Provisional Application 62/202,681, filed Aug. 7, 2015, both of which are hereby incorporated by reference in their entireties.

BACKGROUND

Various types of electronic devices currently exist for communications and entertainment purposes. More and more, consumers are using electronic devices during travel adventures, extreme work conditions, and in other various environments where the electronic devices could be exposed to dirt, dust, impact, drops, and/or other damaging forces. The electronic devices can include various types of mobile phone, smartphone, tablet computer, personal digital assistant, camera, GPS tracker, health monitor, medical device, and/or other types of electronic devices. These devices often include touchscreens, scroll wheels, switches, buttons, or other interactive controls. Due to the sensitive nature of these electronic devices, it is desirable to provide protection for these devices so that they can be used in various environments that the consumer desires.

SUMMARY

A protective enclosure for an electronic device is provided. The protective enclosure is configured such that the electronic device can fit within the protective enclosure and be protected from drops, shocks, damage, misuse, dirt, debris, and the like. In certain instances, the protective enclosure can include a back structural member that snaps together with a front structural member to enclose the electronic device. A first cushioning member can be disposed over the back and front structural members to cushion the electronic device while installed in the protective enclosure. In certain instances, the back structural member and the first cushioning member can include at least one opening for access to a feature on the back surface of the electronic device. In certain instances, the openings in the back structural member and the opening in the first cushioning member can be aligned.

In another aspect, a protective enclosure for an electronic device is provided. The protective enclosure can include a hard shell that includes a front member and a back member, an external cushioning member surrounding the hard shell, and an internal cushioning member disposed between the back surface of the electronic device and the internal surface of the back member of the hard shell, the internal cushioning member covering the back surface and side surfaces of the electronic device. In certain aspects, an opening is present in the back member of the hard shell, an opening is present in the external cushioning member that aligns with the opening in the back member. In certain aspects, a portion of the internal cushioning member extends through the openings of the back member of the hard shell and the external cushioning member, the portion of the internal cushioning member aligning with the an outer surface of the external cushioning member.

In another aspect, a protective enclosure is provided having a hard shell with first and second shell members that cover and surround an electronic device. A first cushion layer can be disposed over a portion of the hard shell to cushion and protect the electronic device within the hard shell. A second cushion layer can be disposed between the electronic device and the shell member that covers the back surface and the side surfaces of the electronic device. Openings in the hard shell and the first cushion layer can be provided and aligned along the back surface of the electronic device to allow access to a feature of the electronic device. In some elements, the feature on the back surface of the electronic device can be a camera and flash combination. The second cushion layer can include a perimeter portion around an opening that also aligns with the first cushion member and the hard shell. The perimeter portion can be configured to extend through the openings of the protective enclosure and make contact with the first cushion layer that surrounds the hard shell of the protective enclosure.

In certain embodiments, the front member and back member of the hard shell can be connected with corresponding snap connections on the front member and back member of the hard shell. The corresponding snap connections can be located along any side of the protective enclosure and in some embodiments the protective enclosure can have a plurality of snap connections along the side and top of the protective enclosure.

In certain embodiments, the external cushion layer can expose the snap connection or corresponding snap connections of the hard shell of the protective enclosure. The external cushion layer can include a protective portion that extends from the external cushion layer and surrounds the exposed corresponding snap connections of the hard shell. The protective portions of the external cushion layer can extend beyond the corresponding snap connections of the hard shell and protect the snap connections from any external surfaces that the protective enclosure may encounter.

In certain embodiments, a flexible membrane can be included with the protective enclosure. The flexible membrane can be configured to cover a touchscreen of the electronic device and can be attached to an inner surface of the front member of the hard shell.

In certain embodiments, the connected front member and back member of the hard shell can provide openings for aspects of the electronic device along the side portions of the electronic device. The openings can accommodate access to functional features and control features of an electronic device. The openings can be positioned to provide access to such things as speakers, headphone jack access, silence toggle switch, volume controls, power controls, and the like of the electronic device. When aligned with the control feature of the electronic device, the openings allow functional access to the control feature of the electronic device while the electronic device remains housed and retained within the protective enclosure.

In certain embodiments, the front structural member can provide a protective rim surrounding the touchscreen of the electronic device when the electronic device is installed within the protective enclosure. The protective rim can be sized to accommodate for a flexible membrane or touchscreen cover to be installed over the touchscreen of the electronic device.

In certain embodiments, the external cushion layer can include a plug or cover for covering the functional features and control features of an electronic device. These plugs or covers can be sized the same as the opening in the connected front and back members of the hard shell and be retained by the opening of the hard shell, and pulled open when access is desired to some features of the electronic device.

In certain embodiments, the external cushion layer can provide raised portions that cover a functional feature of the electronic device. These raised features can mimic the size and location of the functional feature of the electronic device, including volumes buttons, power buttons, and the like.

This Summary is provided to introduce a selection of concepts in a simplified form that are further described below in the Detailed Description. This Summary is not intended to identify essential features of the claimed subject matter, nor is it intended to limit the scope of the claimed subject matter.

BRIEF DESCRIPTION OF THE DRAWINGS

Embodiments of the present invention will be described and explained through the use of the accompanying drawings in which.

DETAILED DESCRIPTION

Figure 1:
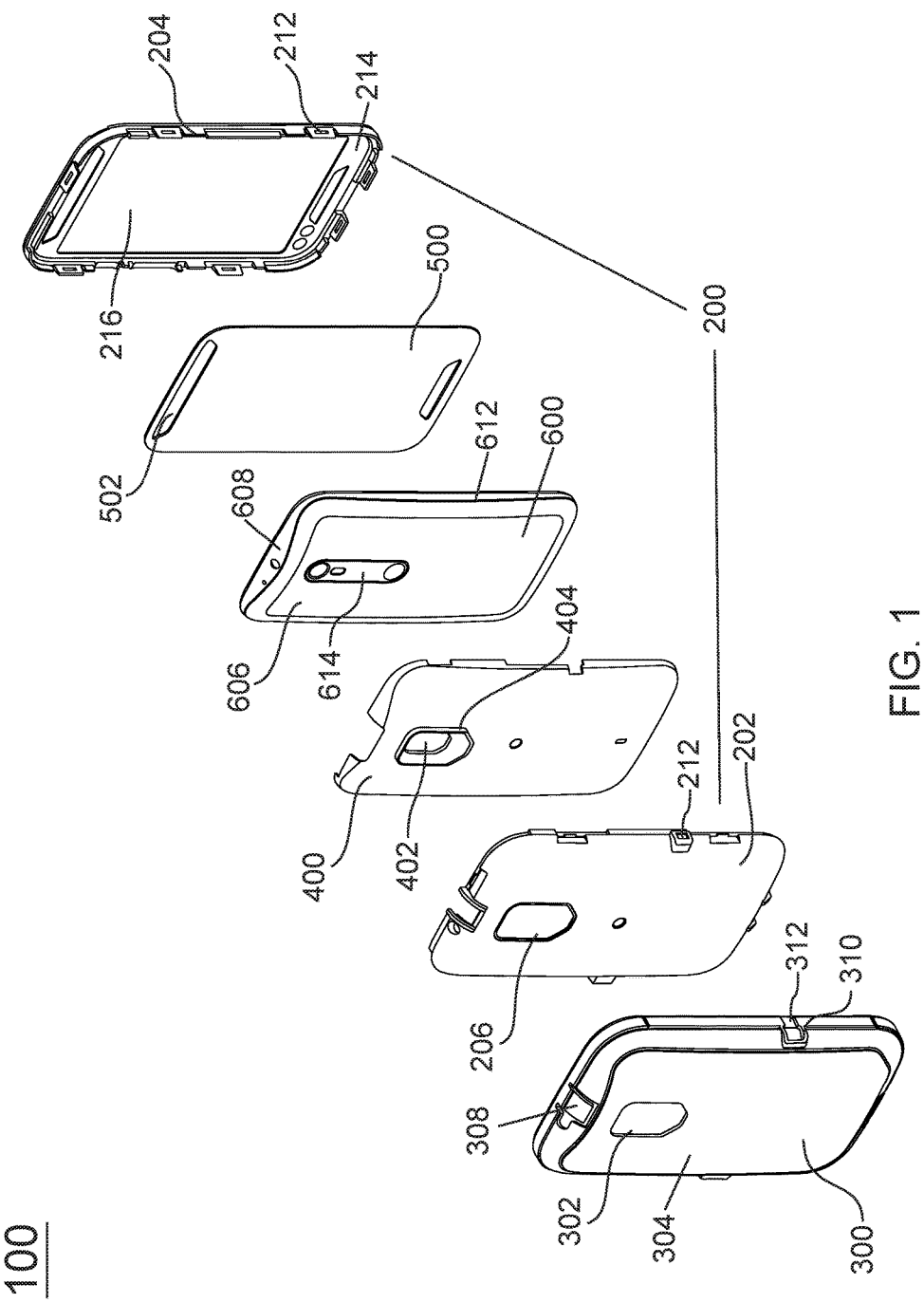
FIG. 1 shows a rear isometric exploded view of a protective enclosure.

In the following detailed description, various specific details are set forth in order to provide an understanding of and describe the apparatuses and techniques introduced here. However, the techniques may be practiced without the specific details set forth in these examples. Various alternatives, modifications, and/or equivalents will be apparent to those skilled in the art without varying from the spirit of the introduced apparatuses and techniques. For example, while the embodiments described herein refer to particular features, the scope of this solution also includes embodiments having different combinations of features and embodiments that do not include all of the described features. Accordingly, the scope of the techniques and solutions introduced herein are intended to embrace all such alternatives, modifications, and variations as fall within the scope of the claims, together with all equivalents thereof. Therefore, the description should not be taken as limiting the scope of the invention, which is defined by the claims.

The subject matter described herein relates to a protective enclosure for an electronic device. It is desired to have the electronic device protected from adverse environmental conditions, mishandling, and/or damage from drops and falls. It is desirable that the protective enclosure for the electronic device be a multi-layered case. The protective enclosure can be of any appropriate size and dimension so long as it is capable of housing an electronic device and protecting it, for instance from drops and scratches, dust and debris.

Particularly, in certain embodiments, the protective enclosure can be a case for encasing, at least partially, an electronic device, such as a mobile phone, smartphone, tablet computer, personal digital assistant, camera, GPS tracker, health monitor, medical device, or the like. In other instances, the protective enclosure can be part of the electronic device, which protects the various components and/or electronic circuitry of the electronic device. For example, the protective enclosure can be or can include the housing of a mobile electronic device, or smartphone, which encases the electronic components of the electronic device.

A protective enclosure of this disclosure can be of any suitable shape, having any suitable size, dependent on the actual dimensions of the electronic device it is meant to encase. However, in certain instances, the dimensions of one class of protective enclosure can fall within the following ranges. The thickness of various members, whether individually or when layered together, can have a thickness of about 25 mm or less, such as 20 mm or less, about 15 mm or less, about 10 mm or less, about 8 mm or less, about 5 mm or less, about 4 mm or less, about 3 mm or less, about 2 mm or less, about 1.5 mm, or 1 mm or less, even about 0.1 mm. For example, in various instances, such as where an electronic device such as a mobile phone, smartphone, tablet computer, personal digital assistant, camera, GPS tracker, health monitor, medical device, or the like is to be contained within the protective enclosure, the thickness of a top portion and/or bottom portion and any side portions, individually or layered together, can be less than about 5 mm to even about 1 mm thick. However, in other instances, the thickness of various members, whether individually or layered together, can have a thickness of about 30 mm or more, about 40 mm or more, about 50 mm or more, or even about 80 mm, or 100 mm or more.

In certain instances, such as where an electronic device such as a smartphone, tablet computer, electronic reader, camera, or video display is to be contained within the protective enclosure, the weight of any portion of the protective enclosure, individually or layered together, can be less than about 5 or about 4 ounces, less than about 4 or about 3 ounces, or for example less than about 2 or about 1 ounces. However, in various instances, an enclosure of the disclosure may have a weight and construction that is substantially greater than the above, such as more than about 10 or about 20 ounces, more than about 30 or about 50 ounces, or more than about 60 or about 80 ounces, and including more than about 100 ounces.

Further, in certain instances, the length and/or width of the protective enclosure may be such that it is no longer or wider than about 22 mm of the underlying electronic device it is designed to encase, no longer or wider than about 20 mm or about 15 mm, no longer or wider than about 10 mm or 5 mm of the underlying electronic device the protective enclosure is designed to encase. Accordingly, in certain instances, a protective enclosure is configured to be substantially form fitting with the electronic device it is meant to contain. However, in various instances, an enclosure of the disclosure may be substantially longer or wider than the dimensions listed above, such as, for instance, longer or wider by about 75 mm or about 85 mm, or for instance longer or wider by about 100 mm than the underlying electronic device the protective enclosure is designed to encase.

To ensure the appropriate thickness, length and/or width and/or weight of the protective enclosure have been provided, the electronic device can be fitted into the protective enclosure and the protective enclosure can be tested for its ability to provide shock and drop protection, such as by experimentally dropping the protective enclosure and electronic device. In some instances, the protective enclosure with the electronic device housed within can be tested to specific drop standards, or even military standards, in order to comply with certain specifications set forth by the assertions of the stated protection that the protective enclosure can provide the electronic device. The thickness, length, and/or width and/or weight of the protective enclosure should be provided in such dimensions so that the retained electronic device is not broken, cracked, or otherwise damaged by the dropping and testing.

The electronic device can have a front surface. The front surface of the electronic device can comprise a touch screen, which can be a capacitive sensing touch screen or other type of interactive control panel. In other embodiments, the front surface of the electronic device can have a keyboard or buttons along with, or in lieu of, a touch screen or other display. The electronic device can have a back surface, and together with the front surface, the electronic device can be surrounded by a perimeter portion.

The electronic device can have side surfaces. The side surfaces can include a top surface, or top-side surface, a bottom surface, or bottom-side surface, and opposing side surfaces. The side surfaces along with the front surface and back surface provide the housing of the electronics, battery, and other components of the electronic device. The side surfaces, including the top surface and bottom surface, of the electronic device can have additional features of the electronic device, including buttons and controls and access points.

The electronic device can have buttons and controls that, along with the screen, make the electronic device function. The buttons and controls on the electronic device can be a power button, can be volume controls, can be a silencing toggle, can be a headphone port, can be a microphone, and in some instances the buttons can be a keyboard or other controls for enabling the electronic device to function.

The electronic device can have a camera. The camera can be located on a surface of the electronic device and in some instances can be located on the back surface of the electronic device. The camera can include a flash and in some instances can be located on the back surface of the electronic device. In some instances, other features might be located near the camera of the electronic device, including a speaker, microphone, or other sensors. In other instances, the electronic device can have a second camera, sometimes located on the front surface of the electronic device. Other features might also be located near this second camera of the electronic device, including a speaker, microphone, or other sensors.

The electronic device can have a speaker. The speaker can be located on a surface of the electronic device and in some instances can be located along a perimeter surface of the electronic device and on a bottom surface of the electronic device. The speaker can be one speaker, or a combination of speakers spread across one or more surfaces of the electronic device. The electronic device can also have accessible areas for power connections and for headphone connections. These areas can be located along a surface of the electronic device and in some instances be located on the bottom surface or the top surface of the electronic device.

The electronic device can have a main button for assisting in controls on the touch screen. In some instances, this main button, sometimes called a home button, can be located on a peripheral area of the front surface of the electronic device, outside of the area of the interactive touch screen. The home button can be located along any portion of the touch screen on the front surface of the electronic device and in some instances the home button is located at the bottom portion of the touch screen.

FIG. 1 shows a rear exploded view of one embodiment of a protective enclosure 100 for an electronic device 600. The electronic device 600 can have a back portion 606, a top portion 608, and a side portion 612. The electronic device 600 can include a camera and flash feature 614 on the back portion 606. The protective enclosure 100 for electronic device 600 can include a front structural member 204 and a back structural member 202. The front structural member 204 and the back structural member 202 can snap tightly together to form a hard shell 200 that surrounds the electronic device 600. The front structural member 204 and the back structural member 202 can snap tightly together with one or a plurality of corresponding snap connections 212. The snap connections 212 of the hard shell 200 can be located along any one or more of the side portions 612 of the electronic device 600.

The corresponding snap connections 212 can have a molded male and female component, in one instance the male snap connection 212 can be located on the front structural member 204 and the corresponding female snap connection 212 can be located on the back structural member 202. In other instances, the corresponding snap connection can be connected with the male snap connection on the back structural member and the female snap connection on the front structural member. In other instances, the snap connections 212 can be separate components that are attached to the front structural member 204 and/or back structural member 202. In some instances, the snap connections 212 can be made of the same material as the front structural member 204 and/or the back structural member 202 or can be made of a different material and can be attached to the front structural member 204 and/or the back structural member 202. In even other instances, the snap connections 212 can connect and engage using other methods of connection other than a male/female connection.

A stretchable external cushioning member 300 can fit snugly over the assembled hard shell 200 and provide a cushioning component to the outside of the protective enclosure 100 and the electronic device 100 installed within the protective enclosure 100. An internal cushioning member 400 can fit snugly between a back portion 606 of the electronic device 600 and an internal surface 208 (not shown in FIG. 1) of the back structural member 202 of the hard shell 200. The cushioning members, individually and in combination, reduce the magnitudes of forces experienced at outer surfaces of protective enclosure 100, such as forces due to dropping or impact that may be transferred to electronic device 600 inside protective enclosure 100. While a portion of an external force may still get transferred to electronic device 600 inside protective enclosure 100, the cushioning members reduce the magnitudes to a point where little or no damage to electronic device 600 may occur. Beneficially, there are two separate layers of cushioning protecting electronic device 600 and electronic device 600 may have no contact with any hard or rigid portion of protective case 100. In some cases, the two cushioning layers may have complementary characteristics, such as different durometers, to provide protection against a wider range of forces.

The protective enclosure 100 can include a protective flexible membrane 500 that is configured to cover the front portion 602 and touchscreen 604 (not shown in FIG. 1) of the electronic device 600. The protective flexible membrane 500 can also be referred to as a flexible member, a touchscreen cover, a membrane member, a membrane assembly, or a membrane. The flexible membrane 500 can fit on an internal surface 214 of the front structural member 204 and the electronic device 600 and be sized to cover and protect a touchscreen 604 that can be located on the front portion 602 of the electronic device 600.

As shown in FIG. 1, the front structural member 204 is formed to provide an opening 216 for touchscreen 604 or a display of the electronic device 600. The opening 216 can also be formed to provide access to a keyboard or other input device on the front portion 602 of the electronic device 600. The front structural member 204 can include openings for other features on the front portion 602 of the electronic device 600, such as speakers, camera, flash, or other sensors. In some embodiments, the openings for features on the front portion 602 of the electronic device 600 can also provide for a screen or vent assembly, to prevent the passage of dust and dirt to the features of the electronic device 600. In other instances, these vent assemblies can include features for resisting or preventing water or liquid from contacting the features of the electronic device.

The front structural member 204 can be made of any sufficient hard plastic or the like. The front structural member 204 can be made of a polycarbonate, ABS material, propylene, thermal plastic, metal, or other rigid material. In some cases, one or more of the components may be manufactured using an injection molding process. The molded front structural member 204 can have the same or a similar shape as the front portion 602 of the electronic device 600 and help to seal the electronic device 600 within the protective enclosure 100. The front structural member 204 can include snap connection components 212. These snap connections 212 can be formed along the sides and/or top and/or bottom portion of the front structural member 204. These snap connections 212 on the front structural member 204 can be aligned to interact with snap connections 212 on the back structural member 202 and help to secure the electronic device 600 within the hard shell 200 of the protective enclosure 100.

The back structural member 202 can be formed to snap tightly onto the front structural member 204. The back structural member 202 can have an opening 206 that allows access to a feature of the electronic device 600. This feature can in some instances be a camera and/or flash feature 614 on the back portion 606 of the electronic device 600. The back structural member 202 can include other openings, or a portion of an opening, that when snapped together with the front structural member 204 which may include another corresponding portion of an opening, can provide access to other features of the electronic device 600. These other openings can be for a headphone jack, speakers, power buttons, electrical ports, volume buttons, or the like. The back structural member 202 can be made of the same material, or in some instances be made of a different material, as the front structural member 204, which can be a polycarbonate, ABS material, propylene, thermal plastic, metal, or other rigid material used during an injection molding process.

In some embodiments, the back structural member 202 and front structural member 204 that comprise the hard shell 200 can comprise more than two pieces. In other embodiments, the components of the hard shell 200 can snap together from the top and bottom of the protective enclosure, or only cover a front portion of the electronic device, or only cover a back portion of the electronic device.

Figure 11:
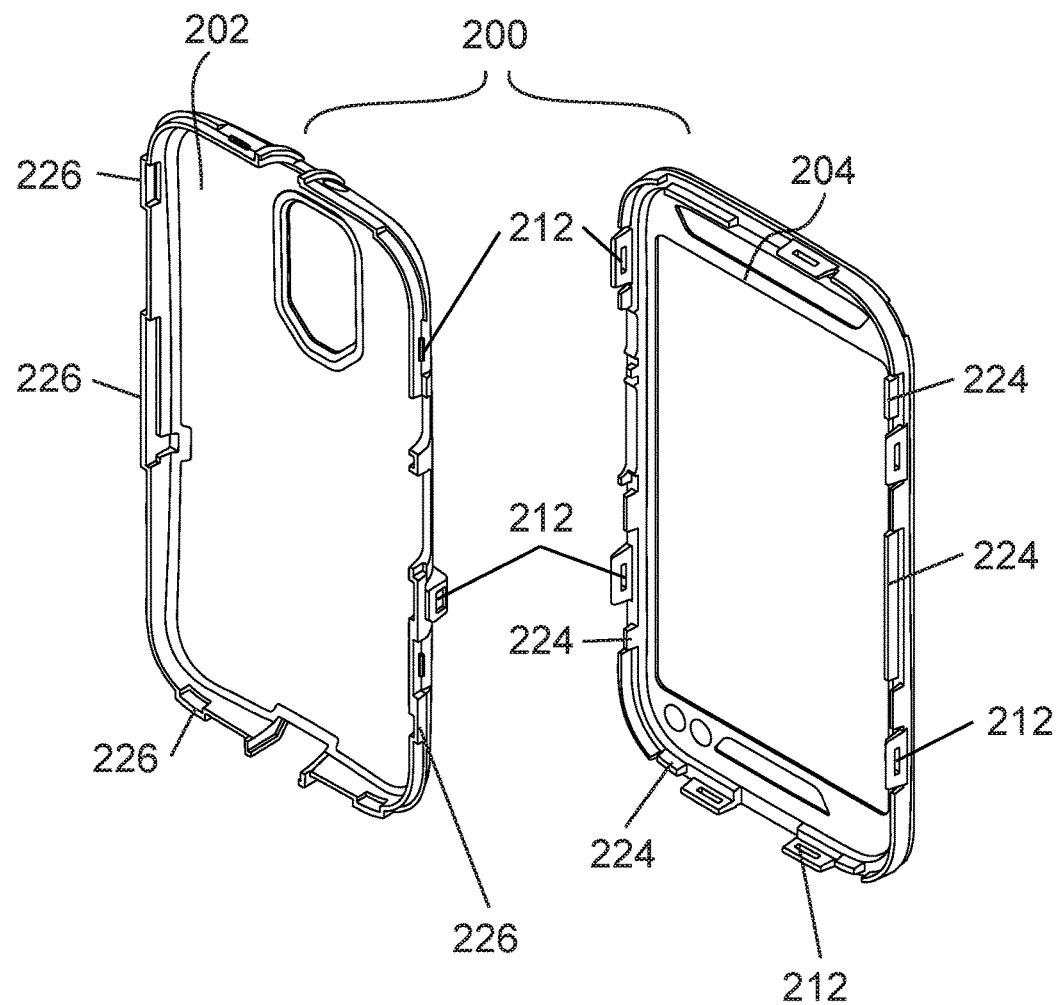
FIG. 11 shows a front isometric view and rear isometric view of components of a protective enclosure.

The hard shell 200 can include inner lid lips 224 and outer lid lips 226. As illustrated in FIG. 11, the inner lid lips 224 can be located along the perimeter wall portions of the front structural member 204 of the hard shell 200. The outer lid lips 226 can be located along the perimeter wall portions of the back structural member 202 of the hard shell 200. In other instances, the inner lid lips 224 can be located on the back structural member 202 of the hard shell and the outer lid lips 226 can be located on the front structural member 204 of the hard shell 200. In even other instances, some inner lid lips 224 can be located on both the front structural member 204 and the back structural member 202, and some outer lid lips 226 can be located on both the front structural member 204 and the back structural member 202 of the hard shell 200.

The inner lid lips 224 of the hard shell 200 can be located along an interior section of the perimeter portion of the front structural member 204. The outer lid lips 226 can be located along an outer section of the perimeter portion of the back structural member 202. The inner lid lips 224 and the outer lid lips 226 can also be referred to as lid lip inversions that are located along the hard shell 200 of the protective enclosure 100. When the front structural member 204 is connected to the back structural member 202 and secured with the snap connections 212 to form the hard shell 200, the inner lid lips 224 can align with and in some instances contact the corresponding outer lid lips 226 and form wall portions of the hard shell 200 along any of the side and top and bottom portions of the hard shell 200. The length of each inner lid lip 224 and outer lid lip 226 can vary and range from being a small portion of a wall portion of the hard shell 200 to a longer portion, in some instances extending the length of the wall portion of the hard shell. The inner lid lips 224 and outer lid lips 226 can be located along one side, two sides, three sides, or four sides of the protective enclosure 100. In addition, more than one lid lip pair can be present along any one side of protective enclosure 100.

The wall portions of the hard shell 200 where the inner lid lips 224 and outer lid lips 226 align and make contact can provide torsional rigidity to the hard shell 200 and the protective enclosure 100. The inner lid lips 224 and outer lid lips 226 can align along respective sides of each lip that extend away from the front structural member 204 and back structural member 202. The lid lips can align and make contact parallel with the wall portions of the hard shell 200. When the protective enclosure 100 experiences an impact or a drop, the inner lid lip 224 can be forced against the outer lid lip 226 and disperse or distribute the force received from the impact or drop along the wall portions of the hard shell 200 and can reduce the impact or drop force from being transferred to the installed electronic device 600 in the protective enclosure 100. When the protective enclosure 100 is subjected to a drop or external force along an edge or corner of the protective enclosure 100, this might subject the protective enclosure 100 to a secondary impact along an opposing edge or corner edge. In some instances, this secondary impact to the protective enclosure 100 can subject the protective enclosure 100 and/or installed electronic device 600 to bending and potential damage. The aligned inner lid lips 224 and outer lid lips 226 of the connected hard shell 200 can prevent bending damage by exerting any torsional or bending forces against each other and dispersing some or all of the torsional or bending forces along the wall portions of the hard shell 200 of the protective enclosure 100, and therefore reducing the forces to the installed electronic device 600 within the protective enclosure 100.

As illustrated in FIG. 1, the stretchable external cushioning member 300 can be configured to fit snugly over the assembled back structural member 202 and front structural member 204 of the hard shell 200. The external cushioning member 300 provides cushioning to the exterior of the protective enclosure 100 and to the electronic device 600 that is installed within the protective enclosure 100. The external cushioning member 300 can be made of one or more materials such as silicone, rubber, urethane, or other material that is capable of stretching sufficiently to allow the external cushioning member 300 to stretch around the assembled hard shell 200 and the external cushioning member 300 is stiff enough to stay conformed to shape of the hard shell 200 of the protective enclosure 100.

The external cushioning member 300 can include an opening 302 that aligns with the opening 206 in the back structural member 202. The opening 302 can allow access to the camera and flash feature 614 of the electronic device 600 when the electronic device 600 is installed within the protective enclosure 100 such that the camera, flash, and/or other feature can be used or operated while electronic device 600 is inside protective enclosure 100. In some embodiments, separate openings can be included in the external cushioning member and/or the hard shell 200, with each opening surrounding one or more of the camera, flash, or other feature of the electronic device. In some embodiments, the external cushioning member 300 can include other openings that align or don't align with other openings in the back structural member 202 or the front structural member 204 of the hard shell 200.

As illustrated in FIG. 1, an internal cushioning member 400 is provided that can fit snugly between the back portion 606 of the electronic device 600 and the internal surface 208 (not shown in FIG. 1) of the back structural member 202. The internal cushioning member 400 can provide added cushioning to the electronic device 600 that is installed within the protective enclosure 100 in a drop situation. Internal cushioning member can also provide scratch resistance to the back portion 606 and side portions 612 of the electronic device with respect to any hard or rigid portions of protective case 100. The internal cushioning member 400 can also reduce or prevent rub marks or wear marks that often form on electronic devices due to small movements or vibrations with an enclosure. The internal cushioning member 400 can extend along the entire back portion 606 of the electronic device 600. The internal cushioning member can also extend along one or more of the side portions 612, top portion 608, and bottom portion 610 of the electronic device to provide cushioning support to the electronic device 600. In other instances, the internal cushioning member 400 can cover only a portion or segment of the back portion 606 and the side portions 612 of the electronic device 600. The internal cushioning member 400 can be made of any soft, cushioning material such as silicone, rubber, urethane, or other material that is capable of providing cushioning support.

The internal cushioning member 400 can include an opening 402 that is aligned with the opening 302 of the external cushioning member and the opening 206 of the back structural member 202. When the internal cushioning member 400 is installed within the internal surface 208 of the back structural member 202, and the back structural member 202 is snapped together with the front structural member 204, and the external cushioning member 300 is installed around the connected back structural member 202 and front structural member 204, forming the hard shell 200, the opening 402 of the internal cushioning member 400 aligns with the opening 206 of the back structural member, which also aligns with the opening 302 of the external cushioning member 300, providing access to the camera and flash feature 614 of the electronic device 600 from outside the protective enclosure 100. In some embodiments, the protective enclosure 100 may not require an internal cushioning member 400. In other embodiments, only a portion of an internal cushioning member 400 is included and need not cover an entire back surface of the electronic device. For instance, a portion of an internal cushioning member that surrounds and aligns only with the opening 302 of the external cushioning member and the opening 206 of the back structural member 202. In other embodiments, external cushioning member 300 may not be included or required.

The internal cushioning member 400 can include a protruding portion 404 that can surround the opening 402 of the internal cushioning member 400. The protruding portion 404 can be long enough to extend through the opening 206 of the back structural member 202 and long enough to extend through the opening 302 of the external cushioning member 300 when the members are connected and installed forming the protective enclosure 100. The protruding portion 404 can extend through the opening 206 of the back structural member 202 and the opening 302 of the external cushioning member 300 and be formed to contact or connect with the outer surface 304 of the external cushioning member 300. The protruding portion 404 can line a portion of the opening 302 of the external cushioning member 300, or can line the entire opening 302 of the external cushioning member 300, while providing access to the camera and flash opening 614 of the electronic device 600. The protruding portion 404 can assist in sealing the exterior of the protective enclosure 100 from dust, dirt, debris, and in some instances, water or liquids. In some embodiments, the internal cushioning member 400 can be permanently connected to the back structural member 202, by overmolding, glue, adhesive, or other method of attachment. In other embodiments, the internal cushioning member 400 can be removable and replaceable.

As illustrated in FIG. 1, the flexible membrane 500 can attach to the internal surface 214 of the front structural member 204 and be configured and shaped to the cover the touchscreen 602 and the front portion 602 of the electronic device when the front structural member 204 is installed onto the electronic device 600. Flexible membrane 500 can be made from a soft, plastic layer such as PVC, polycarbonate, urethane, or silicone material that can be molded, such as by thermoforming, casting, stretching, heating, or injection molding, or otherwise shaped to fit to the front portion 602 of the electronic device 600. The flexible membrane 500, which can also be referred to as a touchscreen cover, can have a thickness of around 0.004 inches to 0.020 inches in order to still be able to interact with the touchscreen 604 of the electronic device when the flexible membrane 500 is installed over the touchscreen of the electronic device. The flexible membrane 500 can be made from a single material and it may be desirable to use a clear, thin hard layer of plastic or glass to provide a clear, transparent material that covers the touchscreen 604 of the electronic device 600, protecting the touchscreen from scratches and dust and debris. In other cases, the flexible membrane 500 can be made from multiple materials and/or include multiple layers of materials. Although flexible membrane 500 is described as 'flexible' in most embodiments herein, flexible membrane 500 may also comprise a rigid, or somewhat rigid, material in some embodiments.

The flexible membrane 500 can include openings 502 that allow access to features on the front portion 602 of the electronic device. These features of the electronic device can include a speaker, microphone, a secondary or front facing camera, or the like.

The flexible membrane 500 can be adhered to the internal surface 214 of the front structural member 204 using glue or other adhesive material. In some instances, the flexible membrane 500 can be permanently connected to the front structural member 204 using ultrasonic welding or overmolding. In some instances, flexible membrane 500 may be captured or held in place but may not be adhered to any of the other components of protective enclosure 100. In yet other instances, it may not be desirable to use a flexible membrane 500 as part of the protective enclosure 100, therefore having the front structural member 204 of the hard shell 200 configured to more tightly fit along the shape of the front portion 602 of the electronic device 600.

In some instances, the flexible membrane 500 can include a shock absorbing adhesive 508 (shown in FIG. 8) that adheres the flexible membrane 500 to the internal surface 214 of the front structural member 204. The shock absorbing adhesive 508 can also be referred to as an energy absorbing layer of the protective enclosure. In addition to adhering the flexible membrane 500, the shock absorbing adhesive can assist in protecting the installed electronic device 600 from damage from drops and external forces applied to the protective enclosure 100. The energy absorbing layer can assist in protecting the front surface of the electronic device when external forces are applied to the front portion of the protective enclosure or if the protective enclosure is dropped on a front portion. The shock absorbing adhesive 508 can be made of a very high bond acrylic adhesive or similar material and can range in thicknesses. In some instances, the shock absorbing adhesive can be about 0.88 mm thick but can vary depending on the desired fit of the protective enclosure 100 surrounding and protecting the installed electronic device 600.

The shock absorbing adhesive 508 can be adhered on one side to the internal surface 214 of the front structural member 204 and on the other side to the flexible membrane 500, keeping the flexible membrane 500 closely touching and even directly touching the touchscreen 604 of the electronic device 600 when the electronic device 600 is installed in the protective enclosure 100. This is ideal for reducing or eliminating gaps between the flexible membrane 500 and the touchscreen 604 of the electronic device 600 that could affect the interaction with the touchscreen 604 through the flexible membrane 500 when the electronic device 600 is installed in the protective enclosure 100.

Figure 2:
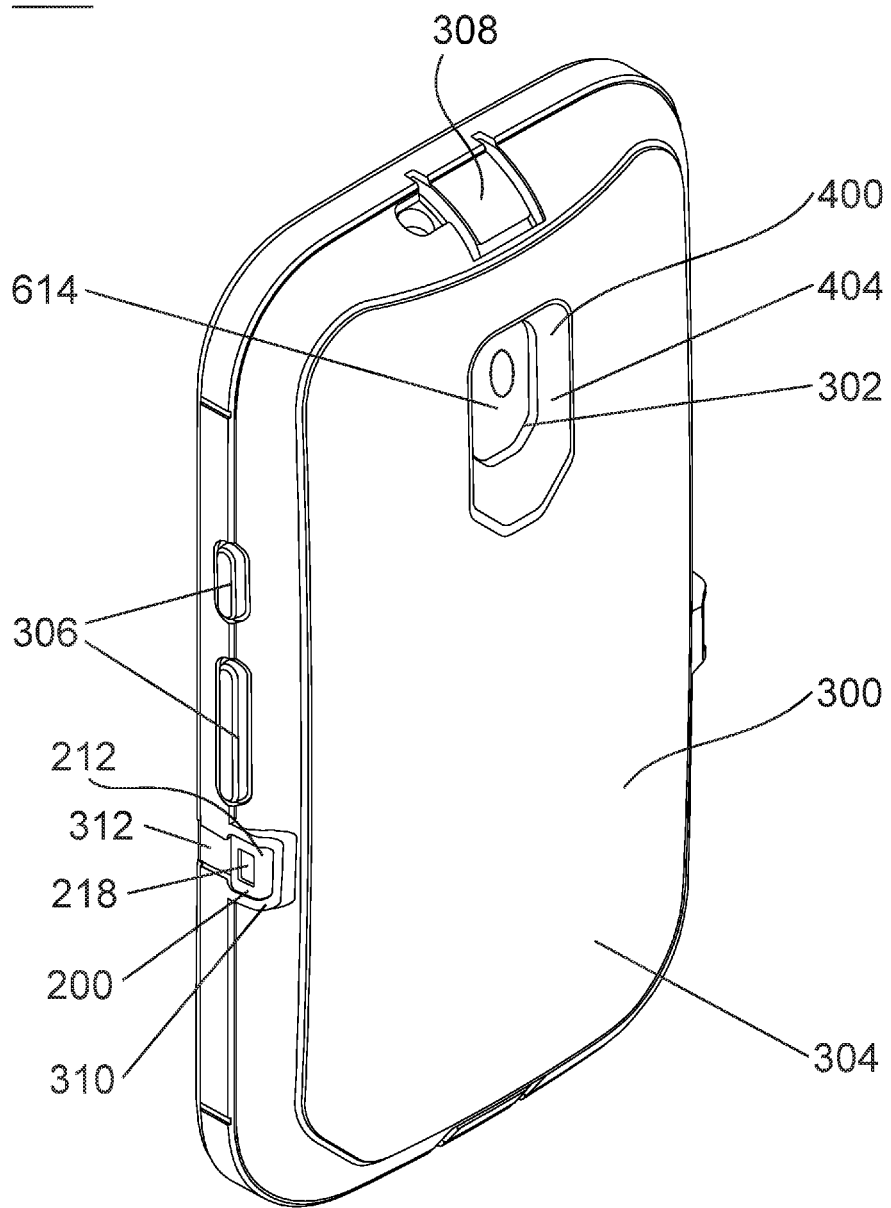
FIG. 2 shows a rear isometric view of a protective enclosure.

FIG. 2 illustrates a back isometric view of a protective enclosure 100. The external cushioning member 300 is shown fitting snugly around the hard shell 200 and extending along the back portion 606 and side portions 612 of the installed electronic device 600. The external cushioning member 300 can also fit snugly around the hard shell 200 and extend along the top portion 608 and bottom portion 610 of the installed electronic device 600. The external cushioning member 300 can include button covers or pads 306 that are configured to allow a user to activate features of the electronic device 600 that can include volume buttons, power buttons, silence buttons, or the like. The pads or button covers 306 can be aligned with an opening in the connected hard shell 200, the opening in the hard shell allowing access to the features of the electronic device 600 to the pads 306 of the external cushioning member 300. The pads 306 can be configured to be depressed by a user to activate the features of the electronic device while the electronic device 600 is installed in the protective enclosure 100. The pads or button covers 306 can have thinner portions surrounding the pads that allow the pads 306 to flex with respect to the external cushioning member 300.

The external cushioning member 300 can include port openings or plug openings 308 allowing access to features of the electronic device 100 that can include power toggle switches, silence toggle switches, or other features. The plug openings 308 can be aligned with an opening of the connected hard shell 200 of the protective enclosure 100, allowing direct access to the feature of the electronic device 600 when installed in the protective enclosure 100. The plug openings 308 can be formed to have a flexible hinge allowing for access to the feature of the electronic device 600 while the flexible hinge allows the plug opening 308 to stay connected to the external cushioning member 300. The plug openings 308 can also be referred to as hinged flaps that allow access to features of the electronic device 600. The hinged flaps can be formed to fit snugly into the external cushioning member 300 when closed and secured to prevent dust and debris from entering the protective enclosure 100 near the plug openings 308. The hinged flaps can fit snugly within the external cushioning member 300 or can provide a lip that engages with a portion of the corresponding opening of the hard shell 200 for securing the port opening in a closed position. In some embodiments, the plug openings can be separate pieces from the protective enclosure or in some instances can be separate pieces that are tethered to the protective enclosure.

As shown in FIG. 2, the corresponding snap connections 212 between the front structural member 204 and back structural member 202 of the hard shell 200 can be located along a side portion 612 of the electronic device 600. The snap connection 212 can include a divot 218 for engaging with an external holster or other accessory. The external holster or other accessory can have a corresponding knob or protrusion that interacts with the divot 218 in the snap connection 212 for keeping the protective enclosure 100 connected to the holster or other accessory. The external cushioning member 300 can include a protective portion 310 that surrounds snap connection 212 and causes snap connection 212 to be recessed relative to external cushioning member 300 thereby preventing the snap connection 212 of the hard shell 200 from contacting an external surface that the protective enclosure 100 might encounter during use or droppage. The protective portion 310 can prevent the recessed snap connection 212 of the hard shell 200 from getting damaged during use or in a drop or impact situation, or other damaging situation. In addition, the protective portion 310 reduces the likelihood that snap connection 212 contacts an external object or surface thereby further reducing the magnitude of external forces that may be transferred to electronic device 600 inside protective enclosure 100. The protective portion 310 can extend along all sides of the snap connection 212 of the hard shell 200 or a number of sides of the snap connection 212.

The external cushioning member 300 can include a recessed portion 312 on or near the snap connection 212 of the hard shell 200. The recessed portion 312 of the external cushioning member 300 can provide easier access for a holster or accessory to slide along the protective enclosure 100 and make contact with the divot 218 of the snap connection 212 of the hard shell 200. The recessed portion 312 allows for less contact along that portion of the protective enclosure 100 with external accessories or holsters and can prevent damage of the external cushioning member 300 along that portion of the protective enclosure 100. In other instances, a protective enclosure can include divot engagements located in other portions of the protective enclosure, including in the external cushioning member.

FIG. 2 shows the opening 302 on the back of the external cushioning member 300. The opening 302 is aligned with the camera and flash feature 614 of the electronic device 600. The protruding portion 404 of the internal cushioning member 400 can extend through the protective enclosure 100 and engage with the outer surface 304 of the external cushioning member 300. The protruding portion 404, or extended portion, can be shaped to have a beveled wall that surrounds the camera and flash feature 614 of the electronic device 600, the protective enclosure 100 protecting the surrounding back portion 606 of the electronic device 600 from drops, dust, and debris. The protruding portion 404 of the external cushioning member 400 can be any dark color, in some instances black, to reduce or eliminate optical reflections or other optical abnormalities caused by components of protective enclosure 100 that may affect operation of the camera and/or flash. The protruding portion 404 of the external cushioning member 400 can also have a non-reflective surface, such as a matte finish, or other surface treatment to further reduce any unwanted optical effects. Because protruding portion 404 extends through the opening, the optical characteristics described above may be accomplished without providing any surface or optic-related treatments to the other components of protective enclosure 100. Beneficially, the other components can be manufactured in various colors without having to paint or otherwise treat areas of these other components near flash or camera openings to have a dark color or other non-reflective characteristic.

Figure 3:
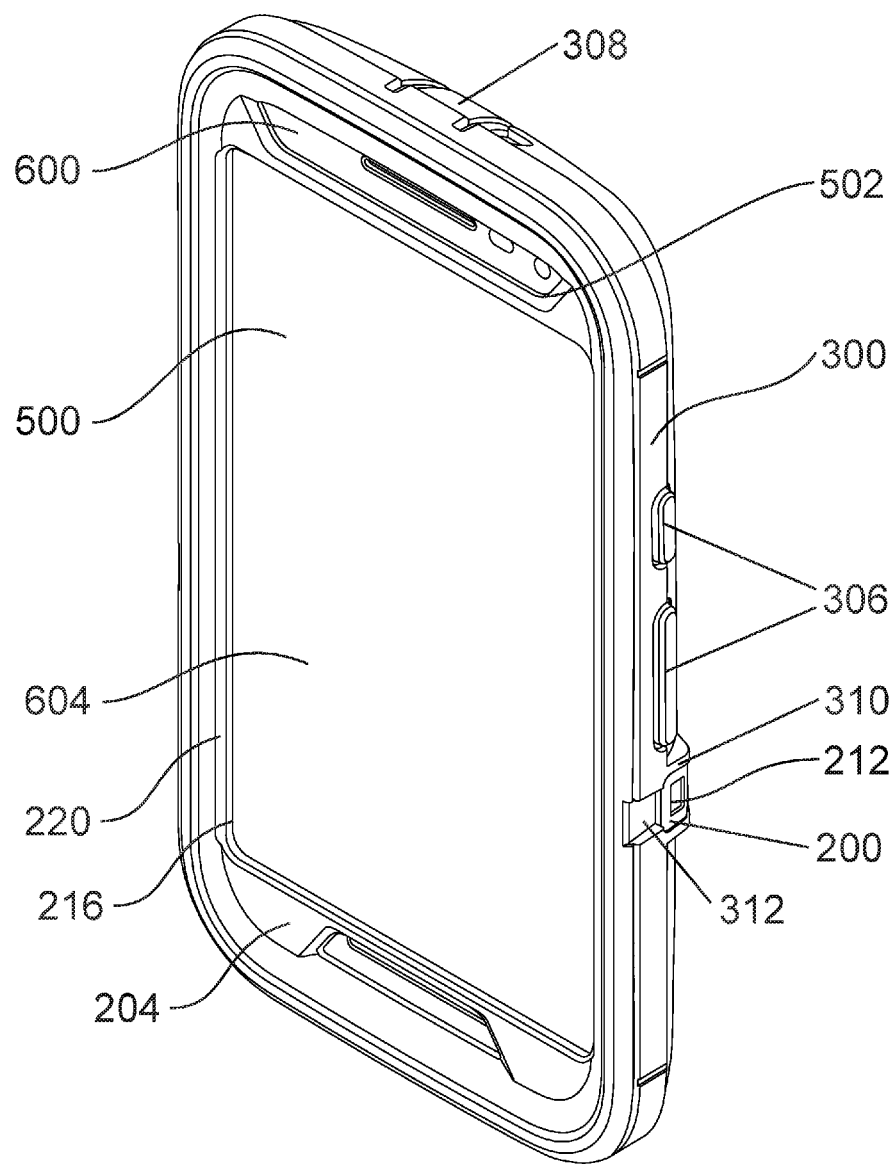
FIG. 3 shows a front isometric view of a protective enclosure.

FIG. 3 illustrates a front isometric view of a protective enclosure 100 for an electronic device 600. The flexible membrane 500 can be shown covering the front portion 602 and the touchscreen 604 of the electronic device 600. The flexible membrane 500 can include openings 502 that allow access to features of the electronic device 600, including microphones, speakers, secondary cameras, or the like. In some embodiments, the openings 502 in the flexible membrane 500 can be completely open and directly expose the features of the electronic device. In other embodiments, the openings 502 of the flexible membrane 500 can include a screen or covering that allows for access to the features of the electronic device 600. The screen or covering can be thin enough and comprise a material that allows for sound transmission or image transmission while covering a sound feature or camera feature of the electronic device. In some embodiments, the screens can be water impermeable or water resistant.

As shown in FIG. 3, the front structural member 204 can protect the front portion 602 of the electronic device 600 and provide an opening 216 to allow access to the touchscreen 604 of the electronic device 600. Along the opening 216 of the front structural member 204, the front structural member 204 can provide a protective rim 220 that can be raised and surrounds the touchscreen 604 of the electronic device 600 and protects it from scratches by preventing the touchscreen 604 from touching an external surface if the protective enclosure 100 is laid on the side where the touchscreen 604 of the electronic device 600 is located. The external cushioning member 300 can wrap around to the front portion 602 of the electronic device 600 and connect with the protective rim 220 of the front structural member 204. In some instances, the protective rim 220 can extend along the entire perimeter of the touchscreen 604 of the electronic device 600, or can provide one or more raised rim portions along the perimeter of the touchscreen 604 when the electronic device 600 is installed in the protective enclosure 100.

In some instances, front structural member 204 can be shaped to accommodate a front portion of the electronic device 600 that is curved or rounds or extends over the side edges and top edges of the electronic device. The front structural member 204 can be shaped to accommodate touchscreen 604 of the electronic device 600 that also curves or rounds over and extends from the front portion of the electronic device 600. The front structural member 204 can be shaped to accommodate the curved front portion of the electronic while allowing for access to the touchscreen and controls that might be located on the curved portions of the electronic device. A flexible membrane 500 can also have a curved shape that can adhere to the inner surface of the curved front structural member 204. The curved flexible membrane can be shaped to cover the touchscreen of the electronic device, including portions of the touchscreen that are curved or extend around an edge of the front portion of the electronic device.

Figure 4:
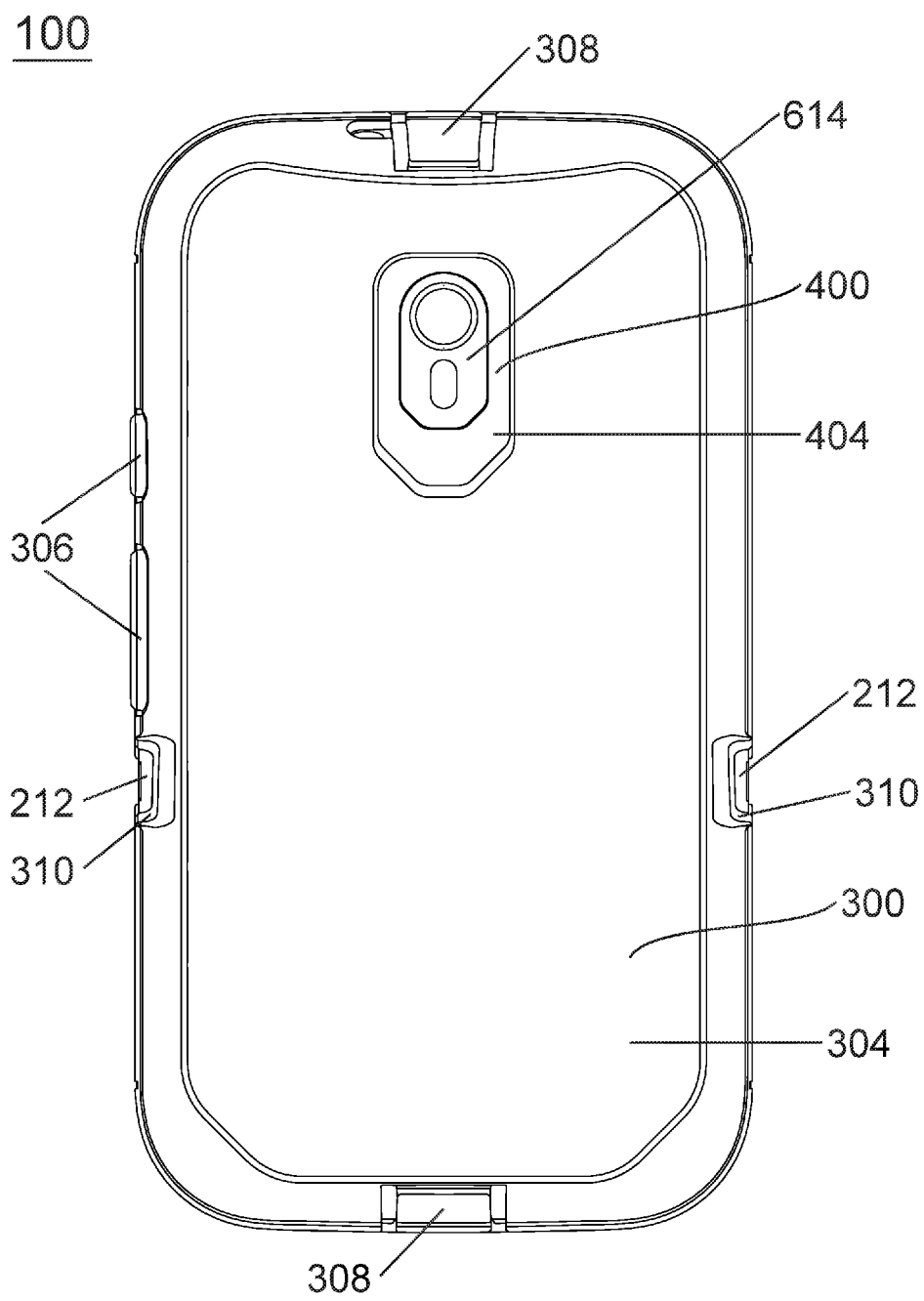
FIG. 4 shows a rear view of a protective enclosure.

FIG. 4 illustrates a back view of a protective enclosure 100 for an electronic device 600. The snap connections 212 can be configured to protrude through the external cushioning member 300, in this instance along the sides of the protective enclosure 100. The corresponding snap connections 212 can protrude through the external cushioning member 300 to allow for divots or indents in the snap connection 212 to connect with a holster or accessory that can interact with the protective enclosure, without damaging the external cushioning member and utilizing the hard surface of the snap connection and hard shell to make a solid connection between the hard shell of the protective enclosure and a corresponding connection point of the holster or accessory. The external cushioning member 300 can include a protective portion 310, or protective rim, around the snap connections 212. The protective rim 310 can be configured to make contact with an external surface, preventing the snap connection 212 of the hard shell 200 to make contact with an external surface. The protective rim 310 can be sized to surround the entire snap connection 212 or a portion of the snap connection 212, and can be configured to absorb external forces, impacts, shocks or vibrations and prevent those external forces, impacts, shocks and vibrations from making contact with the corresponding snap connection 212 of the hard shell 200 and the installed electronic device 600. In some embodiments, other portions of the hard shell 200 can be configured to protrude through openings in the external cushioning member 300 and engage with external components, such as a holster or other accessory.

As shown in FIG. 4, the protective rim 310 of the external cushioning member 300 can be located around the back of the protective enclosure 100 and above and below the snap connections 212. Plug openings 308 are shown along a top portion and bottom portion of the protective enclosure for accessing features of the installed electronic device 600. These features can include a power connection, a data connection, headphone jack port, and/or the like.

The plug openings 308, or port openings, can be sized to the feature of the electronic device 600 that they are positioned over, or the plug openings 308 can be larger than the feature. The plug openings 308 can have a flexible hinge that is part of the external cushioning member 300 and fit snugly within the external cushioning member 300 when in a closed position. The external cushioning member 300 can also include feature covers, or switch pads 306, that can be aligned with a feature of the electronic device 600. These switch pads 306 can be used to activate features of the electronic device 600 such as volume controls, power buttons, or the like from outside protective enclosure 100. Openings in the hard shell 200 can allow for the features of the electronic device 600 that are aligned under a switch pad 306 of the external cushioning member 300 to be exposed through the hard shell 200 so that the flexible switch pads 306 can engage with the features of the electronic device 600 while the electronic device 600 is installed within the protective 100.

Figure 5:
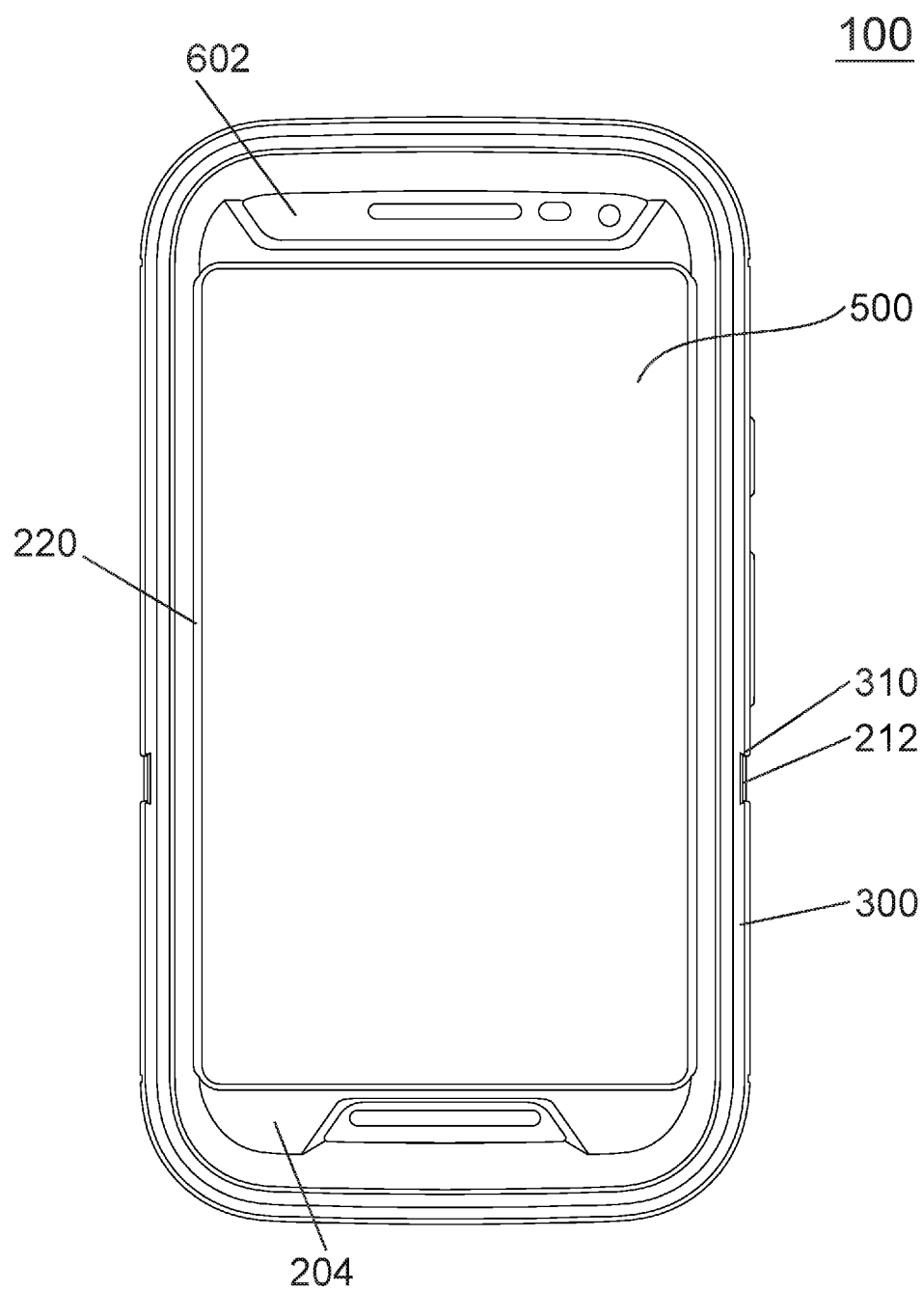
FIG. 5 shows a front view of a protective enclosure.

FIG. 5 is a front view of protective enclosure 100. As shown, the external cushioning member 300 provides cushioning support around the entire perimeter of protective enclosure 100 while providing access to the front portion 602 and touchscreen 604 of the electronic device 600. Also shown in FIG. 5 is a flexible membrane 500 for covering and protecting the touchscreen 604 of the electronic device 600. The protective rim 220 of the front structural member 204 surrounds the touchscreen of the electronic device.

Figures 6A, 6B:
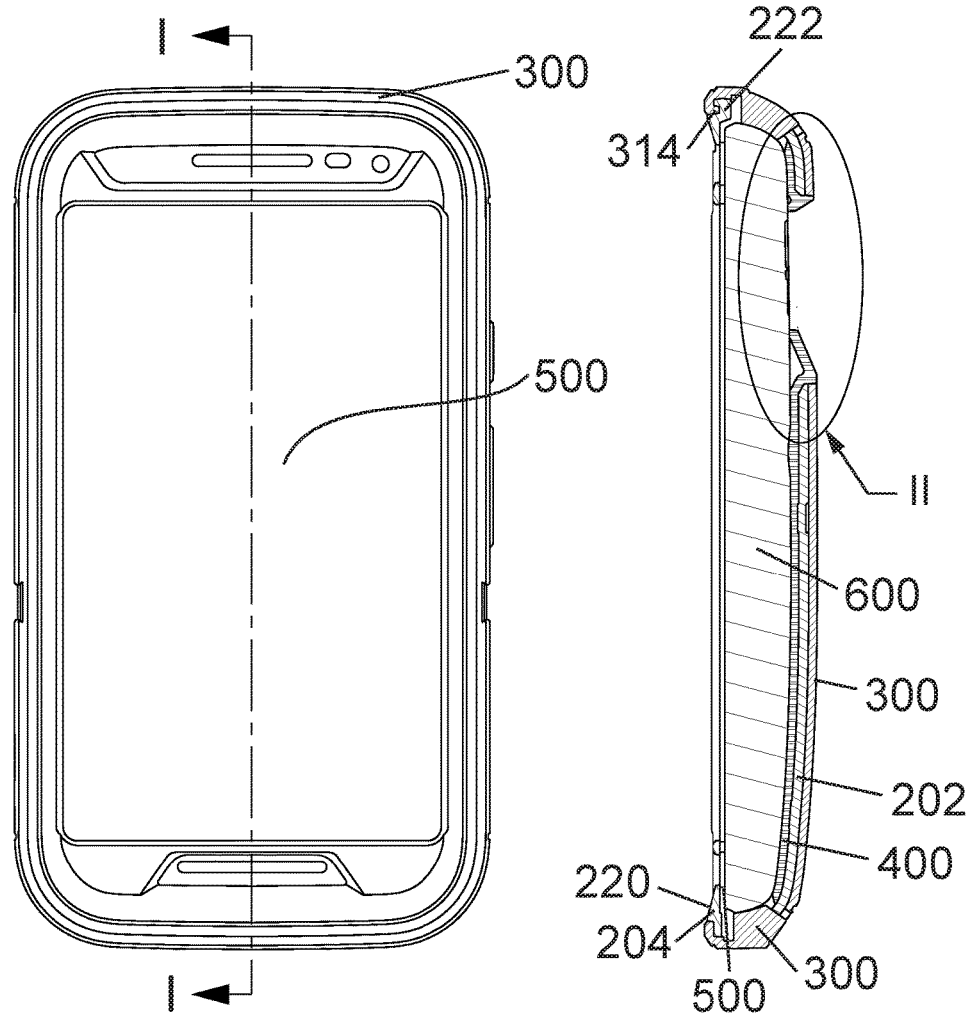
FIG. 6A shows a front view with a cross-section I-I defined of a protective enclosure.
FIG. 6B shows a cross-section view I-I with a close up section-view II of a protective enclosure.

FIG. 6A is a front view of a protective enclosure 100, with a cross-section I-I. FIG. 6B is cross-section I-I of FIG. 6B and shows the internal cushioning member 400 surrounded by the front hard shell 202 and back hard shell 204, then surrounded by the external cushioning member 300 of the protective enclosure 100. FIG. 6B shows the interaction between the external cushioning member 300 and the front structural member 204 of the hard shell. When the external cushioning member is installed around the back portion of the electronic device and over the back structural member 202, the external cushioning member 300 can extend around the front portion of the electronic device and have a tab feature 314. The tab feature can interact with a groove feature 222 of the front structural member 204, sealing the external cushioning member 300 along the front structural member 204 and in turn securing the external cushioning member 300 to the hard shell 200 of the protective enclosure 100. The tab feature 314 and the groove feature 222 can be located anywhere along the front portion 602 or side portions 612 of the electronic device 600. The tab feature 314 and groove feature 222 can extend along an entire perimeter of the front portion 602 of the electronic device 600 or can be located in one or more sections along the perimeter of the electronic device 600 enclosed within the protective enclosure 100.

In some instances, the tab feature for connecting the external cushioning member to the hard shell can be located on the hard shell and the groove connection feature can be located on the cushioning layer. In even other instances, this tab and groove connection can be sealed to create a water-resistant or waterproof seal. In other instances, the tab feature and groove connection feature can be configured to include a gasket providing more of a waterproof seal to the protective enclosure 100.

Figure 7:
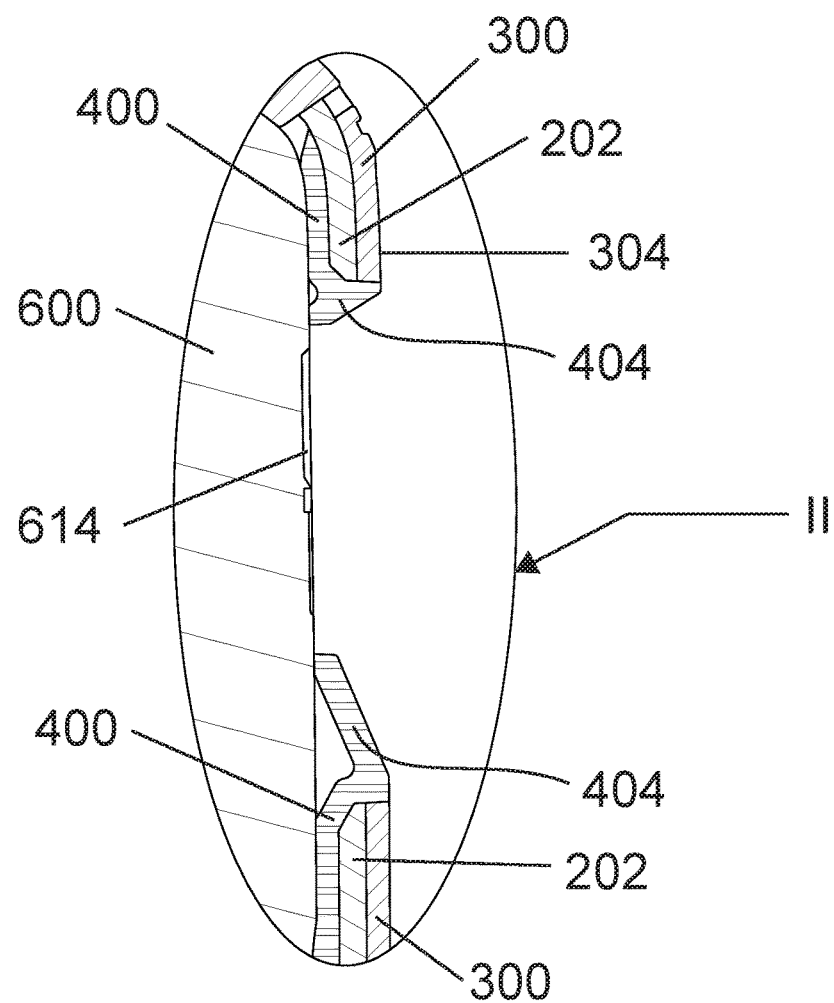
FIG. 7 shows a close up section view II of a protective enclosure.

FIG. 6B includes a section-view II, showing a close-up of a rear portion of the protective enclosure 100 that is detailed in FIG. 7. FIG. 7 shows section-view II and shows a close up of the cross-section of the protective enclosure 100, specifically of the back of the protective enclosure 100 where the camera feature 614 of the electronic device is located. The internal cushioning member 400, or cushioning layer, is shown covering the back portion 606 of the electronic device 600. The back structural member 202 is shown covering the internal cushioning layer 400, and formed to the shape of the back portion of the electronic device 600. The external cushioning member 300 is shown surrounding and cushioning the back structural member 202. The protruding portion 404 of the interior cushioning member 400 is shown protruding away from the back portion of the electronic device 600 and through the layers of the protective enclosure 100 and extending through to the outer surface 304 of the external cushioning member 300. The beveled edge of the protruding portion 404 of the internal cushioning member 400 can be seen extending away from the camera and flash feature 614 of the electronic device 600. In other instances, the protruding portion 404 could extend straight out from the back portion of the electronic device and in even other instances the protruding portion 404 could extend inward.

Figure 8:
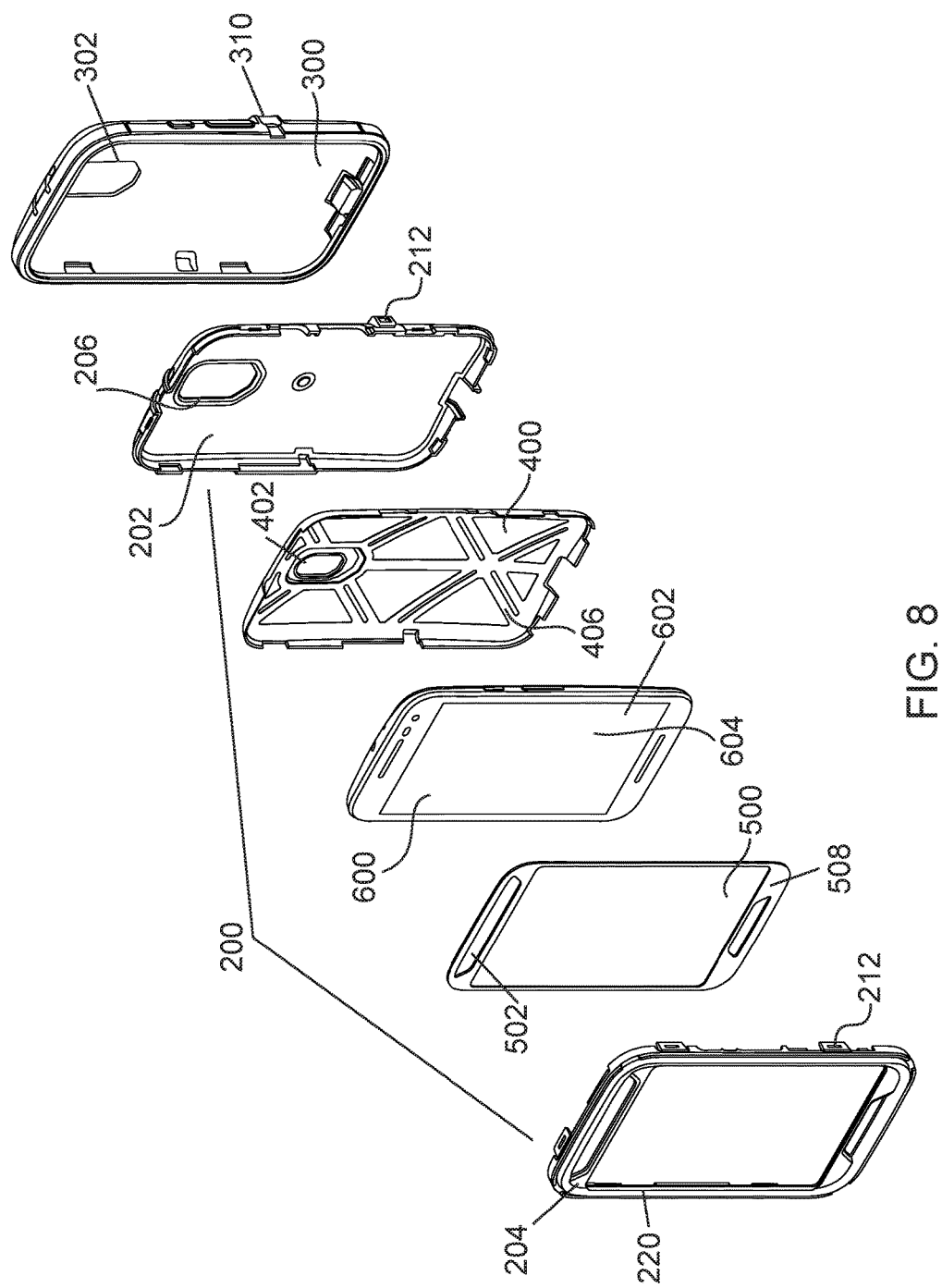
FIG. 8 shows a front isometric exploded view of a protective enclosure.

FIG. 8 is an exploded isometric view of the front of a protective enclosure. Electronic device 600 is protected by flexible membrane 500 covering a front portion of the electronic device. The flexible membrane 500 is adhered to an inner surface of a front protective layer 204. The front protective layer 204 can connect and snap together with a back protective layer 202. An interior cushion layer 400 can be configured to be between the back portion of the electronic and an inner surface of the back protective layer 204, for adding cushioning support to the electronic device when installed in the protective enclosure.

The interior cushion layer 400 can comprise ribs 406, or a ribbed structure, to reduce the weight of the layer but still add cushioning protection to the electronic device when the device is installed into the protective enclosure. The ribs 406 can be located on the inside of the inner cushion layer or on the outside of the cushion layer, or in some instances can extend through the inner cushion layer and form holes or openings throughout the inner cushion layer for even greater weight reduction of the inner cushion layer component 400 of the protective enclosure 100.

The exterior cushion layer 300 can be formed and configured to fit snugly around the snapped together hard shell components and the electronic device. The exterior cushion layer can have an opening 302 that aligns with an opening 206 in the back protective layer 202 of the hard shell components, which in turn aligns with an opening 402 in the inner cushion layer 400. These openings allow access to a feature on the back portion of the electronic device to be fully functional when the electronic device is installed in the protective enclosure. This feature of the electronic device can be a camera and flash feature, or the like. The protective enclosure and its components can include other openings around the installed electronic device for accessing features and controls of the electronic device.

Figure 9:
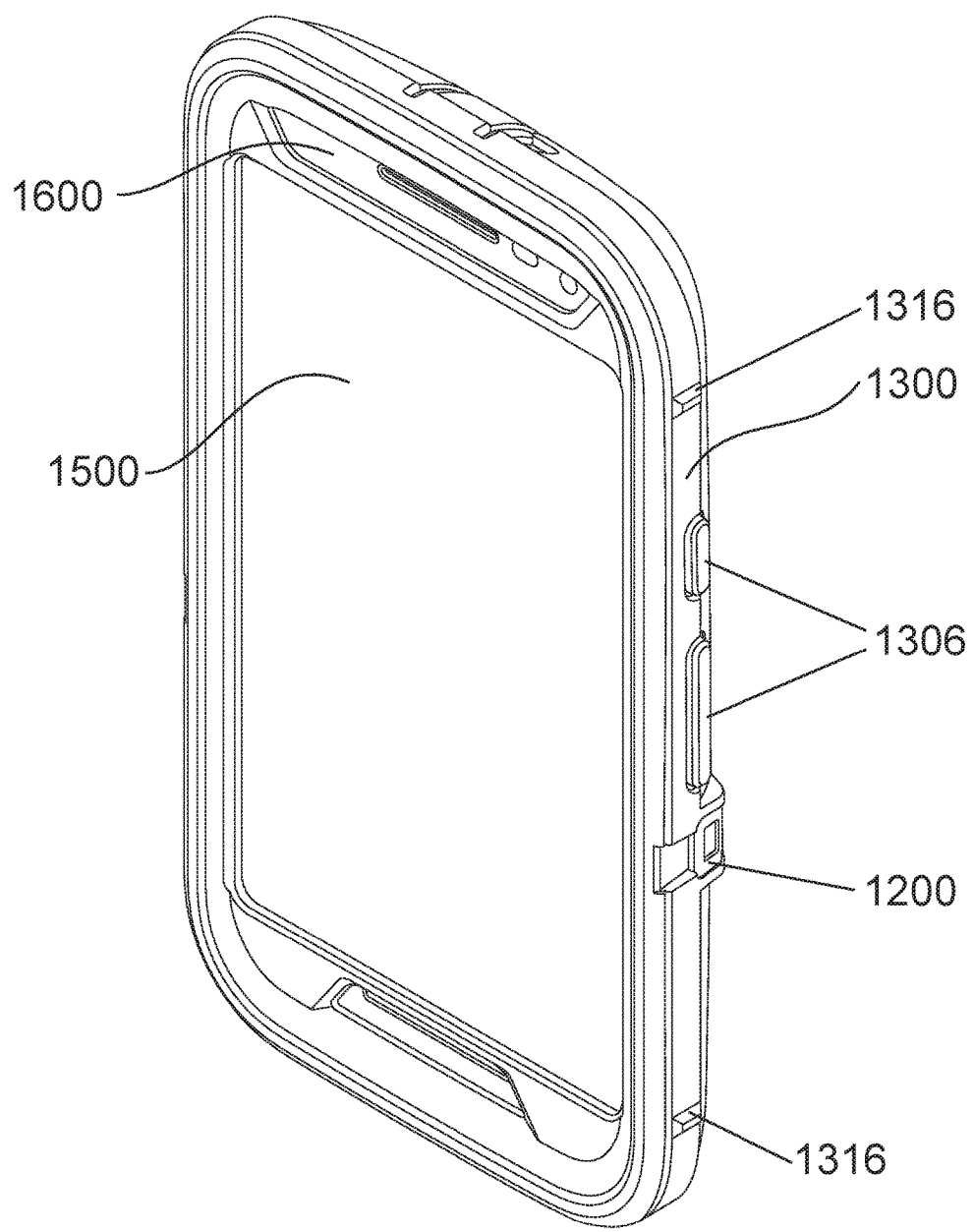
FIG. 9 shows a front isometric view of a protective enclosure.

FIG. 9 illustrates a protective enclosure 800 that includes a hard shell 1200 that is at least partially surrounded by an external cushioning member 1300. A membrane 1500 can cover the front surface, including a touchscreen, of an electronic device 1600 that is installed within the protective enclosure 800. The external cushioning member 1300 can include button covers 1306 that cover and protect feature buttons of an electronic device. The feature buttons of the electronic device can be volume controls, silence buttons, camera buttons, power buttons, or the like. The button covers 1306 of the external cushioning member 1300 can be located along any side of the protective enclosure 800 that is surrounding the installed electronic device 1600, including the top of the protective enclosure 800 or the bottom of the protective enclosure 800.

The hard shell 1200 of the protective enclosure 800 can be an example of the hard shell 200 of the protective enclosure 100, but may also include other features, functions, or features of hard shell 200. The membrane 1500 of the protective enclosure 800 can be an example of the membrane 500 of the protective enclosure 100, but may also include other features, functions, or features of membrane 500. The external cushioning member 1300 can be an example of the external cushioning member 300 of the protective enclosure 100, but may also include other features, functions, or features of external cushioning member 300.

The external cushioning member 1300 can include button protection ribs 1316. The protection ribs, or protective protrusions or protective walls, can be located on either side of the push button covers 1036 of the external cushioning member 1300 and can be tall enough or protrude far enough away from the protective enclosure 800 such that the protection ribs 1316 make contact with an external surface that the protective enclosure 800 may encounter during normal use, or in a drop or impact or external force situation. The protection ribs 1316 are configured to reduce the chances that the button covers 1306, and underlying features of the electronic device, will be inadvertently pressed or activated during normal use, while in a pocket or bag, or in a drop or impact situation.

Figure 10:
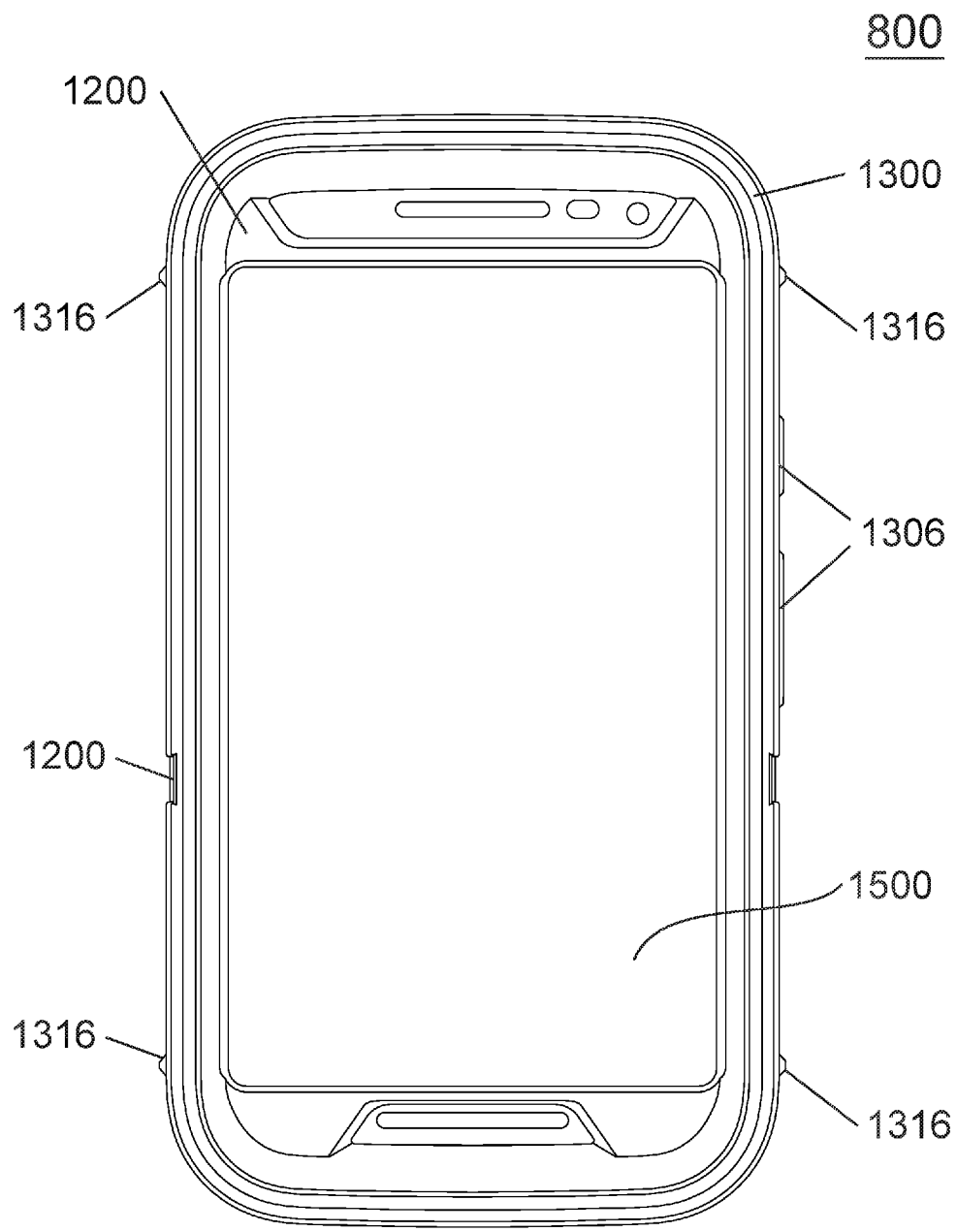
FIG. 10 shows a front view of a protective enclosure.

FIG. 10 shows a front view of protective enclosure 800. The hard shell 1200 is surrounded by an external cushioning member 1300. The external cushioning member 1300 can include protection ribs 1316. The protection ribs 1316 are configured to reduce the chances that the button covers 1306, and underlying features of the electronic device, will be inadvertently pressed or activated during normal use, while in a pocket or bag, or in a drop or impact situation. The protection ribs 1316 can also assist in protecting a side portion of the external cushioning member 1300 and hard shell components 212 that can protrude through the external cushioning member 1300. The protection ribs 1316 can be made of the same material as the external cushioning member 1300 or can be an overmolded or adhered or affixed material, such as a polycarbonate or other hard plastic.

In other embodiments, the flexible membrane of a protective enclosure can be made from a single material or multiple materials that are welded, glued, or formed together into a single membrane. For example, for the portion of the membrane that is disposed over the display screen or touchscreen of an electronic device can be a clear, thin layer of glass or plastic to provide a clear, transparent material over the display screen or touchscreen, to protect the screen from scratches. Other parts of the flexible membrane can be made of a thin layer of polycarbonate, PVC or a silicone material that is highly flexible so that a keyboard or other buttons may be pressed through the membrane. In other instances, it may not be desirable to cover the entire touchscreen or display screen of the electronic device with the flexible membrane, allowing more direct access to a keyboard or other buttons. And in even other instances, it may be desired to not include a flexible membrane as part of the protective enclosure and allow a user to have direct contact with a touchscreen or display screen. In yet other instances, it may be desirable to allow a user to install a secondary screen cover that can be plastic or glass directly to the touchscreen of the electronic device, while installed within the protective enclosure.

In other instances when it may not be desirable to include a flexible membrane as part of the protective enclosure, the front shell can be configured to seal against the touchscreen of the electronic device from water penetrating between the touchscreen of the electronic device and the front shell of the protective enclosure. The front shell can be configured to touch the touchscreen directly, or can in some instances include a gasket attached to the front shell that touches the touchscreen and prevent water from penetrating between the front shell and the touchscreen.

In other instances, a flexible membrane can be made so that just the area around a keyboard or a button is open to allow direct access to the keyboard or button while the other areas that are covered by the membrane remain covered. In addition, various portions of the membrane can be made clear, translucent, opaque, or any desired color, or any combination of these alternatives. The flexible membrane can be made to wrap around a portion of, or all of, the backside of the electronic device and be at least partially sealed together, especially if a self-adhering material is used for the membrane. For example, if a camera is included on the backside of an electronic device, a clear portion of the membrane can be used to cover the camera feature. The membrane can be thermoformed or otherwise molded to fit the specific shape of all, or a portion of, the surfaces of the electronic device to provide a tight, form fit to the electronic device.

In other embodiments, a front shell can fit snuggly over a flexible membrane and snap together with a back shell. The assembly of the front and back shell can form a hard shell housing. The firm fit of the front shell and portions of the back shell can help to seal the hard shell to the flexible membrane, which provides water resistance and prevents dirt and dust from entering the membrane. In some instances, around each of any openings in the front shell and back shell that are adjacent to the flexible membrane, a small ridge can be formed that applies additional pressure to the flexible membrane to further seal the membrane to the front shell and back shell. Each of the small ridges around these openings, such as the display screen opening or a keyboard opening, slightly deforms and seals the edge of the openings to the membrane, which helps in preventing the entry of dust, dirt, and/or moisture into the hard shell and the electronic device installed in the protective enclosure.

In other embodiments, a stretchable exterior cushion layer can be provided that fits snuggly over an assembled hard shell that consists of a front shell and a back shell. The exterior cushion layer provides cushioning in a drop situation and fits snugly over portions of the outside of the assembled hard shell. The exterior cushion layer can be made of a variety of thermoplastic materials to allow the hard shell to slide into an opening of the exterior cushion layer. The stretchable cushion layer has a modulus of elasticity, which can vary across the stretchable cushion layer, but allows the exterior cushion layer to conform to the assembled hard shell. The exterior cushion layer may include pads, such as tilt switch/push button pads, that are connected to the exterior cushion layer with a thinner portion to allow actuation of the switches. The pads can then be depressed by a user to activate a tilt switch or push button. The thinner portion of the pads allow the pads to easily flex with respect to the external stretchable cushion layer.

In other embodiments, a protective enclosure can have an external cushion layer can have elasticity that tightly holds an assembled hard shell together in the external cushion layer. The hard shell can also include an internal cushion layer that is held tightly in place within the protective enclosure. The elasticity of the stretchable external layer prevents the assembled hard shell from separating from the protective enclosure in a drop situation. In addition, the elasticity of the stretchable external layer provides a tight fit, which further adds to water resistance of the protective enclosure.

In some embodiments, the front hard shell and back hard shell of a protective enclosure can be different colors, and in even other embodiments, the inner cushion layer and outer cushion layer of the protective enclosure can be different colors from each other or from the hard shell components. Different textures can also be added to the outer cushion layer to provide appealing designs or grip areas for the protective enclosure. In other instances, pictures or images can be printed on the outer cushion layer of the protective enclosure, either by screen printing or by an in-mold labeling (IML) process.

In some embodiments of a protective enclosure, the front shell and back shell of the hard shell can snap fit together using molded male and female snap connections. In addition, ridges in the back shell can fit tightly within a groove of the front shell to create a tight snap fit between the front and back shell of the hard shell of the protective enclosure.

The elements, components, and steps described herein are meant to exemplify some types of possibilities. In no way should the aforementioned examples limit the scope of the invention, as they are only exemplary embodiments.

The phrases "in some embodiments", "in other embodiments", "in some examples", "in other examples", "in some situations", "in one configuration", and the like generally mean that the particular technique, feature, structure, or characteristic following the phrase is included in at least one embodiment of the present invention and/or may be included in more than one embodiment of the present invention. In addition, such phrases do not necessarily refer to the same embodiments or to different embodiments.

The foregoing disclosure has been presented for purposes of illustration and description. Other modifications and variations may be possible in view of the above teachings. The embodiments described in the foregoing disclosure were chosen to explain the principles of the concept and its practical application to enable others skilled in the art to best utilize the invention. It is intended that the claims be construed to include other alternative embodiments of the invention expect as limited by the prior art.

What is claimed is:

1. A protective enclosure for an electronic device, the electronic device having a front portion, a back portion, a top portion, a bottom portion, and side portions, the front portion of the electronic device having a touchscreen, the protective enclosure comprising:
   a back structural member having a rigid shape which fits the back portion and the side portions of the electronic device when the electronic device is in the protective enclosure, the back structural member having an internal surface and an external surface, the back structural member having a first opening allowing access to a feature on the back portion of the electronic device when the electronic device is in the protective enclosure;
   a front structural member that engages the back structural member to at least partially enclose the electronic device, the front structural member providing access to the touchscreen of the electronic device when the electronic device is in the protective enclosure;
   a first cushioning member disposed over the engaged back and front structural members, the first cushioning member having sufficient elasticity to stretch over the engaged back structural member and the front structural member and to substantially conform to the outer surface of the engaged back structural member and the front structural member, the first cushioning member having a second opening aligned with the first opening of the back structural member; and
   a second cushioning member that conforms to the internal surface of the back structural member, the second cushioning member having a third opening aligned with the first opening of the back structural member and the second opening of the first cushioning member, wherein a portion of the second cushioning member extends through the first and second openings, the portion of the second cushioning member making contact with the first cushioning member.

2. The protective enclosure of claim 1, wherein the front structural member includes a membrane that covers the touchscreen of the electronic device when the electronic device is installed in the protective enclosure, the touchscreen being fully operable when covered by the membrane.

3. The protective enclosure of claim 1, wherein the feature on the back portion of the electronic device is a camera.

4. The protective enclosure of claim 1, wherein the portion of the second cushioning member making contact with the first cushioning member is a dark color.

5. The protective enclosure of claim 1, wherein the front structural member further comprises a raised portion integrally formed in the front structural member around a perimeter of the touchscreen, the raised portion to protect the touchscreen from contacting an external surface.

6. The protective enclosure of claim 1, the back structural member and the front structural member having corresponding snap connections along a side of the protective enclosure, the snap connections removably connecting the back structural member and the front structural member.

7. The protective enclosure of claim 6, the first cushioning member having a protective portion extending around the corresponding snap connections of the back structural member and the front structural member, the protective portion to prevent the corresponding snap connections from making contact with an external surface when the protective enclosure is resting on the side where the corresponding snap connections are located on the protective enclosure.

8. A protective enclosure for an electronic device, the electronic device having a front portion, a back portion, a top portion, a bottom portion, and side portions, the front portion of the electronic device having a touchscreen, the protective enclosure comprising:
   a hard shell that at least partially encloses the electronic device, the hard shell comprising:
      a front member formed to a rigid shape of the front portion of the electronic device, the front member allowing access to the touchscreen of the electronic device when the electronic device is installed in the protective enclosure; and
      a back member formed to a rigid shape of the back portion of the electronic device, the back member providing a first opening that allows access to one or more features on the back surface of the electronic device when the electronic device is installed in the protective enclosure;
   an external cushioning member that at least partially covers the hard shell, the external cushioning member having an outer surface, the external cushioning member having a second opening aligned with the first opening of the back member of the hard shell; and
   an internal cushioning member that is disposed between the back portion of the electronic device and an internal surface of the back member of the hard shell, the internal cushioning member extending along the side portions of the electronic device, the internal cushioning member having a third opening that is aligned with the first opening of the hard shell, wherein a portion of the internal cushioning member extends through the first opening of the hard shell and makes contact with the outer surface of the external cushioning member.

9. The protective enclosure of claim 8, the front member and the back member of the hard shell having corresponding snap connections along a side of the protective enclosure, the corresponding snap connections connecting the front member and the back member.

10. The protective enclosure of claim 9, the external cushioning member exposing the corresponding snap connections of the hard shell, the external cushioning member having a protective portion extending around the exposed corresponding snap connections, the corresponding snap connections recessed within the protective portion of the external cushioning member, the protective portion to prevent the corresponding snap connections from making contact with an external surface.

11. The protective enclosure of claim 8, further comprising a touchscreen cover that is attached to the hard shell.

12. The protective enclosure of claim 8, wherein the one or more features on the back surface of the electronic device includes at least one of a camera and a flash.

13. The protective enclosure of claim 8, wherein at least a portion of the hard shell protrudes through the external cushioning member.

14. The protective enclosure of claim 8, further comprising a raised portion integrally formed on the front member of the hard shell along a perimeter of the touchscreen.

15. The protective enclosure of claim 8, wherein the portion of the internal cushioning member extending through the first opening of the hard shell is black.

16. A protective case for an electronic device, the protective case comprising:
a hard shell having a first shell member and a second shell member, the first and second shell members together encasing at least a portion of the electronic device when the electronic device is installed in the hard shell, the second shell member having at least a first opening to allow access to a feature on a back portion of the electronic device;
a first cushion layer disposed over at least a portion of the hard shell, the first cushion layer having sufficient elasticity to substantially conform to the hard shell, the first cushion layer having a second opening that is aligned with the first opening of the hard shell; and
a second cushion layer disposed between the second shell member of the hard shell and the back portion of the electronic device, the second cushion layer having a third opening that is aligned with the first opening of the hard shell and the second opening of the first cushion layer, the second cushion layer further comprising a perimeter portion that surrounds the third opening, the perimeter portion extending outward through the first and second openings and making contact with the first cushion layer.

17. The protective case of claim 16 further comprising a flexible membrane that is configured to fit over as least a front portion of the electronic device when the electronic device is installed in the protective case.

18. The protective case of claim 16, wherein the feature on the back portion of the electronic device is a camera.

19. The protective case of claim 16, further comprising a raised portion integrally formed on the first shell member of the hard shell along a perimeter of the touchscreen.

20. The protective case of claim 16, wherein the perimeter portion of the second cushioning layer making contact with the first cushioning member is a dark color.

* * * * *